United States Patent
Sakai et al.

(10) Patent No.: US 12,283,792 B2
(45) Date of Patent: Apr. 22, 2025

(54) LIGHT EMITTING DEVICE, AND ELECTRONIC APPARATUS

(71) Applicant: SONY SEMICONDUCTOR SOLUTIONS CORPORATION, Kanagawa (JP)

(72) Inventors: Kiyohisa Sakai, Kanagawa (JP); Hirohisa Yasukawa, Kanagawa (JP); Masayuki Nagao, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 637 days.

(21) Appl. No.: 17/626,278

(22) PCT Filed: Jul. 1, 2020

(86) PCT No.: PCT/JP2020/025772
§ 371 (c)(1),
(2) Date: Jan. 11, 2022

(87) PCT Pub. No.: WO2021/024652
PCT Pub. Date: Feb. 11, 2021

(65) Prior Publication Data
US 2022/0293545 A1    Sep. 15, 2022

(30) Foreign Application Priority Data
Aug. 6, 2019  (JP) .................................. 2019-144174

(51) Int. Cl.
*H01S 5/00*     (2006.01)
*H01S 5/02345*  (2021.01)
(Continued)

(52) U.S. Cl.
CPC ...... *H01S 5/02469* (2013.01); *H01S 5/02345* (2021.01); *H01S 5/02438* (2013.01);
(Continued)

(58) Field of Classification Search
CPC ............ H01S 5/02469; H01S 5/02345; H01S 5/02438; H01S 5/02446
See application file for complete search history.

(56) References Cited

U.S. PATENT DOCUMENTS

2002/0028045 A1\* 3/2002 Yoshimura .......... H01L 23/5389
                                                           385/39
2011/0249980 A1  10/2011 Takemoto et al.
(Continued)

FOREIGN PATENT DOCUMENTS

JP      2001339077 A    12/2001
JP      2002232062 A     8/2002
(Continued)

OTHER PUBLICATIONS

International Search Report prepared by the European Patent Office on Sep. 29, 2020, for International Application No. PCT/JP2020/025772, 3 pgs.

(Continued)

*Primary Examiner* — Kinam Park
(74) *Attorney, Agent, or Firm* — Sheridan Ross PC

(57) ABSTRACT

A light emitting device includes a first substrate, a light source on a first surface of the first substrate and that emits light toward an object, and a driver disposed in the first substrate and that drives the light source. The driver overlaps the light source in a plan view. The light emitting device includes at least one first via disposed in the first substrate and overlapping the driver in the plan view, and a first conductor on a second surface of the first substrate opposite the first surface and overlapping the light source, the driver, and the at least one first via in the plan view. The first conductor is connected to the at least one first via.

20 Claims, 18 Drawing Sheets

(51) Int. Cl.
*H01S 5/024* (2006.01)
*H01L 23/00* (2006.01)

(52) U.S. Cl.
CPC .......... *H01S 5/02446* (2013.01); *H01L 24/20* (2013.01); *H01L 2224/27436* (2013.01); *H01L 2224/32225* (2013.01)

(56) References Cited

U.S. PATENT DOCUMENTS

| | | | | |
|---|---|---|---|---|
| 2013/0163627 A1* | 6/2013 | Seurin | ................ | H01S 5/02345 372/36 |
| 2018/0278011 A1* | 9/2018 | Galvano | ................ | G01S 7/4813 |
| 2021/0143607 A1* | 5/2021 | Yasukawa | ................ | H01S 5/026 |
| 2021/0267043 A1* | 8/2021 | Yoo | ...................... | H05K 1/0206 |
| 2022/0285909 A1* | 9/2022 | Kimura | ................ | H01S 5/0239 |

FOREIGN PATENT DOCUMENTS

| | | |
|---|---|---|
| JP | 2009-170675 | 7/2009 |
| JP | 2010087498 A | 4/2010 |
| JP | 2012227514 A | 11/2012 |
| JP | 2015092524 A | 5/2015 |
| JP | 2016122701 A | 7/2016 |
| JP | 2018129417 A | 8/2018 |
| JP | 2019041201 A | 3/2019 |
| WO | WO 2019/202874 | 10/2019 |

OTHER PUBLICATIONS

Written Opinion prepared by the European Patent Office on Sep. 29, 2020, for International Application No. PCT/JP2020/025772, 9 pgs.
Goldfarb, Marc E. et al., "Modeling Via Hole Grounds in Microstrip", IEEE Microwave and Guided Wave Letters, vol. 1, No. 6, Jun. 1991, pp. 135-137.

* cited by examiner

[Fig. 1]
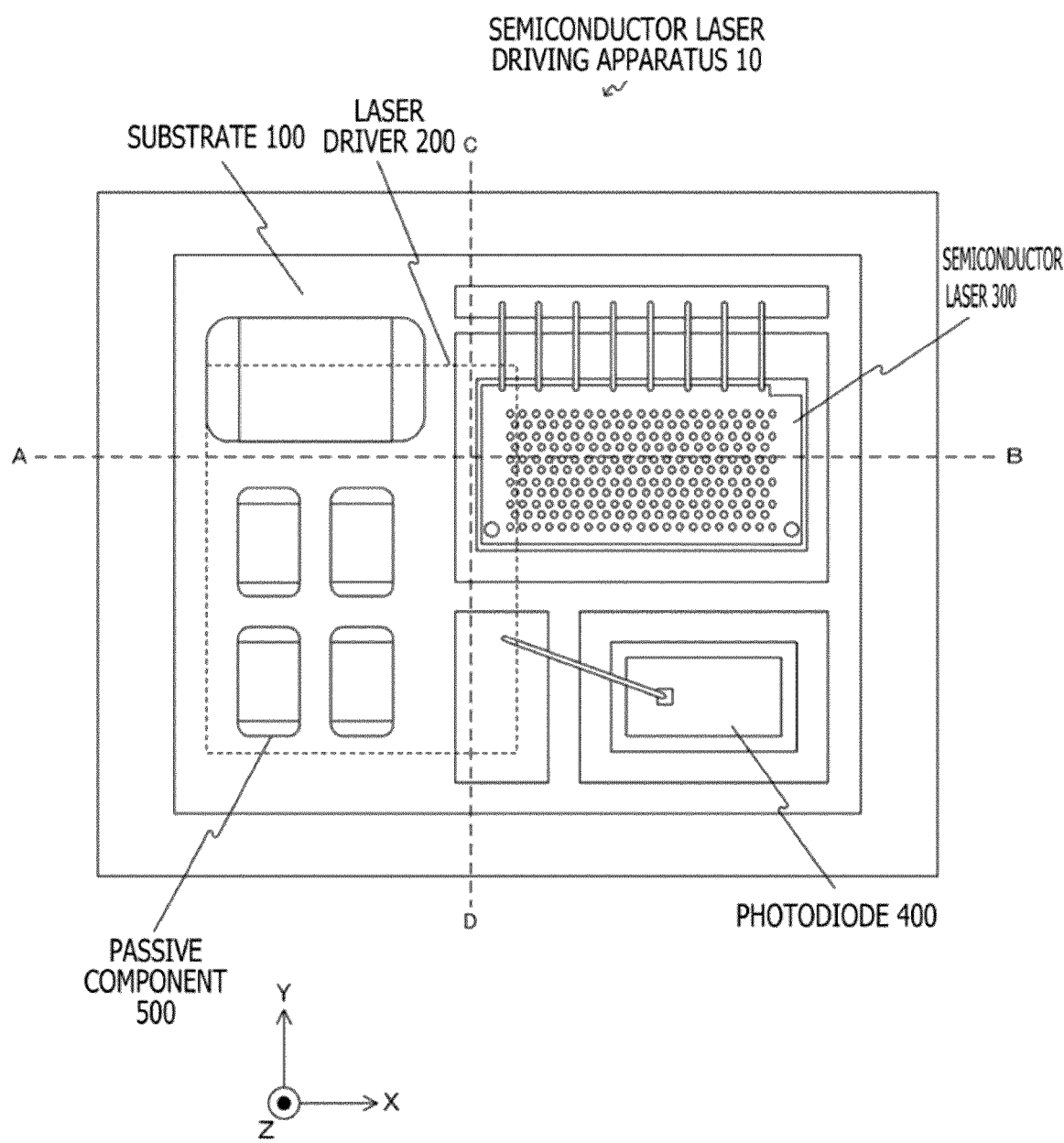

[Fig. 2A]
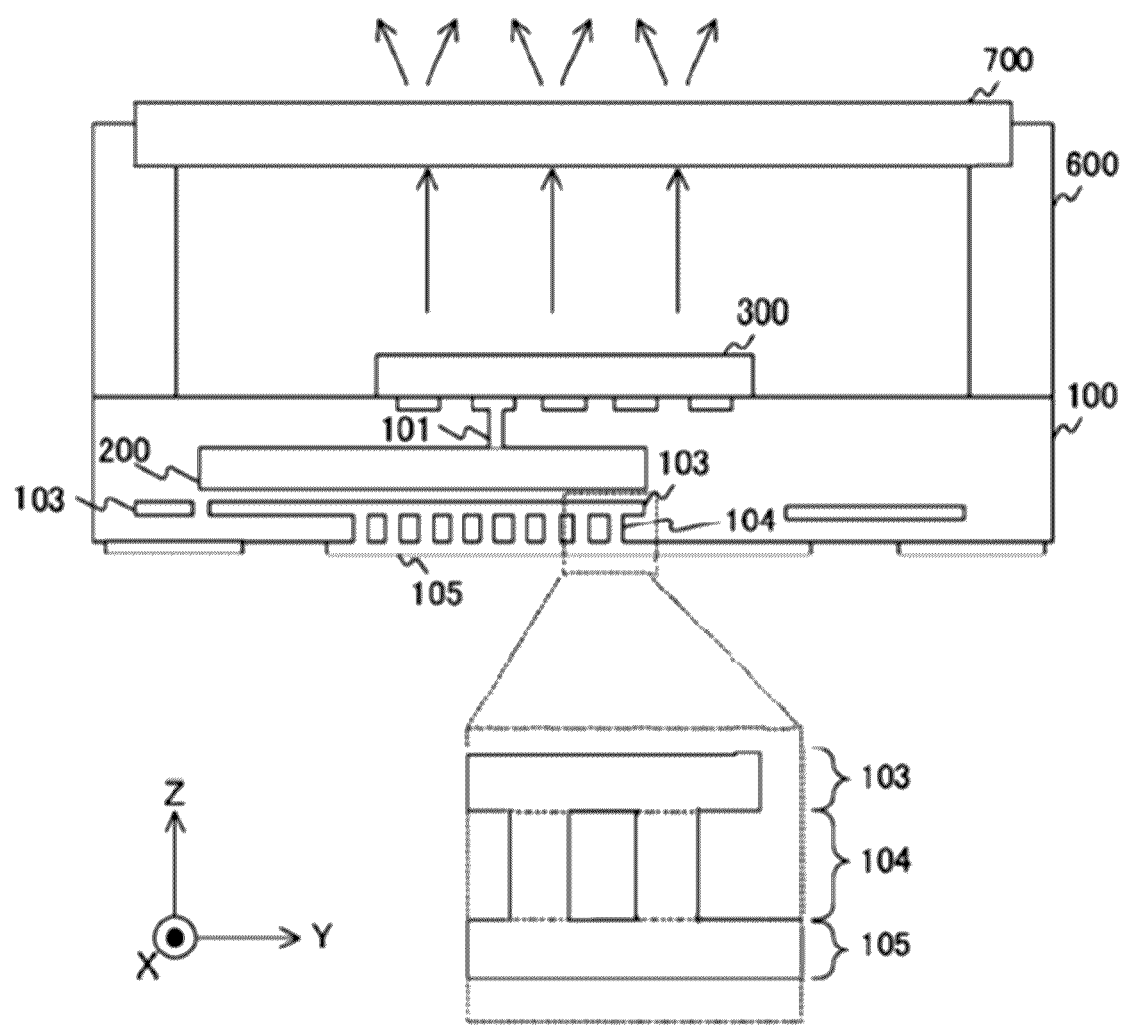

[Fig. 2B]
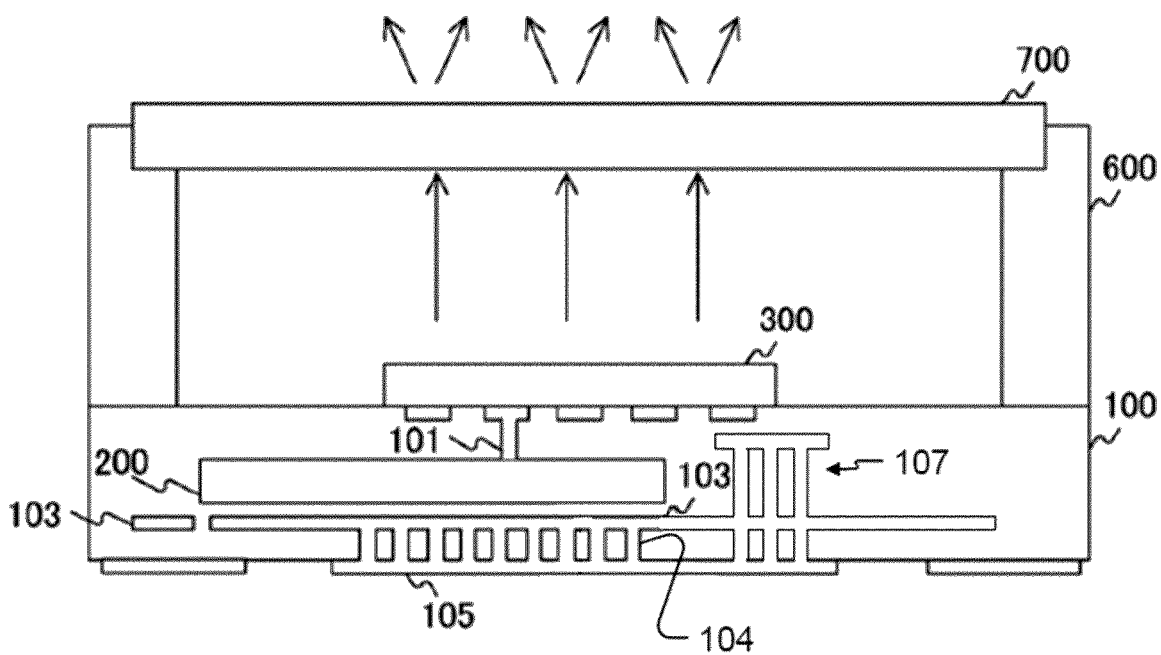

[Fig. 3]
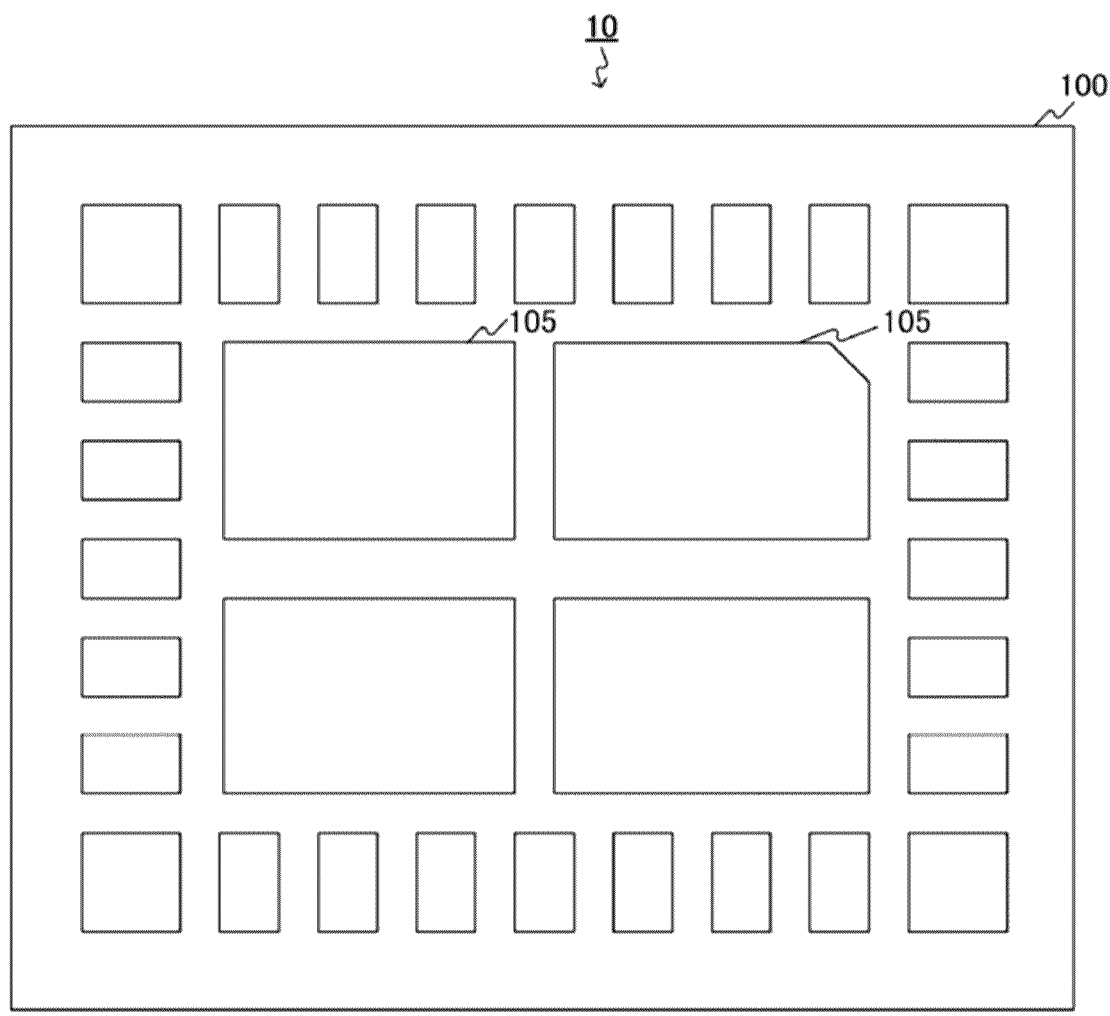

[Fig. 4]
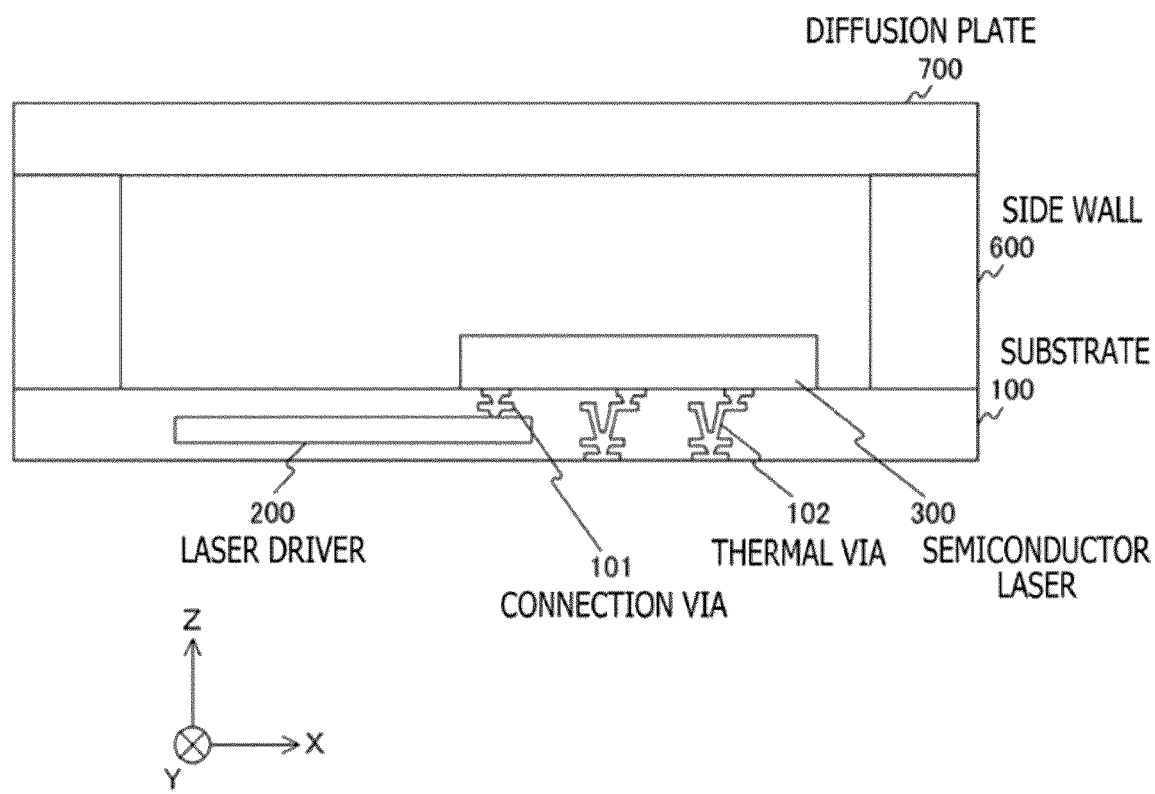

[Fig. 5]
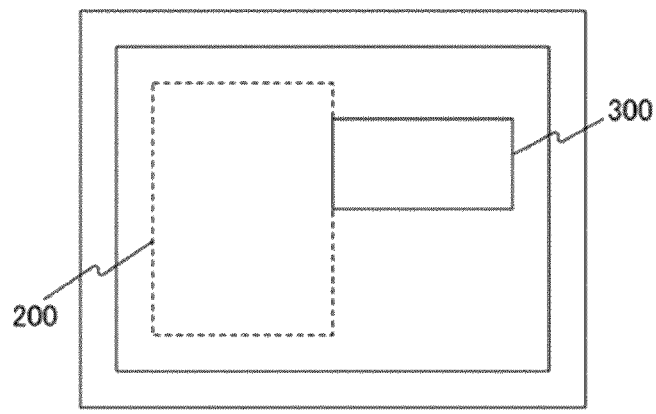
a   OVERLAPPING: 0%
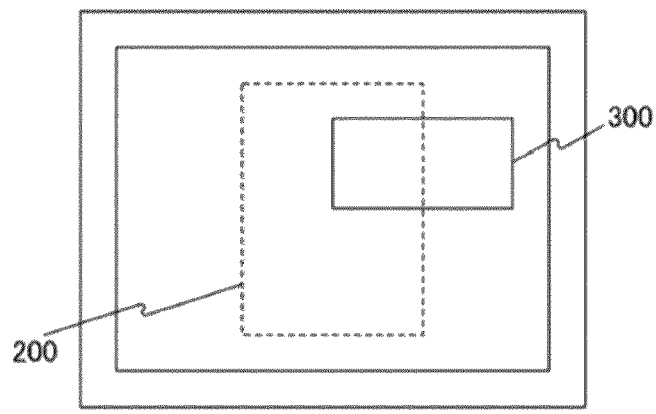
b   OVERLAPPING: 50%
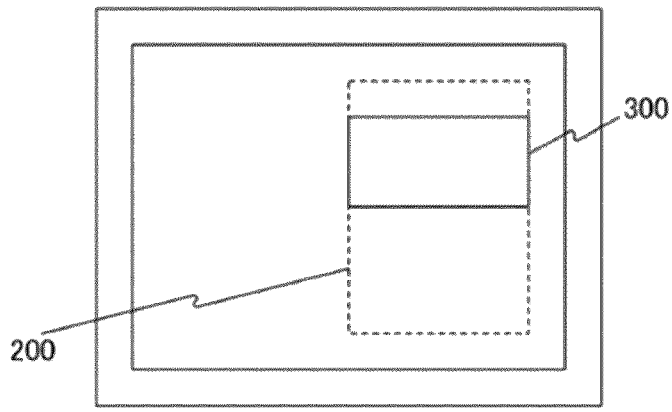
c   OVERLAPPING: 100%

[Fig. 6]

ADDITIVE METHOD (H=15μm)

|  |  | L | | | | |
|---|---|---|---|---|---|---|
|  |  | 0.3mm | 0.5mm | 1mm | 2mm | 3mm |
| W | 0.015mm | 0.21 | 0.40 | 0.94 | 2.16 | 3.48 |
|  | 0.05mm | 0.16 | 0.33 | 0.79 | 1.85 | 3.02 |
|  | 0.1mm | 0.13 | 0.27 | 0.68 | 1.63 | 2.69 |
|  | 0.2mm | 0.09 | 0.21 | 0.56 | 1.39 | 2.33 |
|  | 0.3mm | 0.07 | 0.17 | 0.48 | 1.24 | 2.11 |

[Fig. 7]

SUBTRACTIVE METHOD (H=35μm)

| | | L | | | | |
|---|---|---|---|---|---|---|
| | | 0.3mm | 0.5mm | 1mm | 2mm | 3mm |
| W | 0.035mm | 0.16 | 0.32 | 0.77 | 1.82 | 2.98 |
| | 0.05mm | 0.15 | 0.30 | 0.73 | 1.75 | 2.86 |
| | 0.1mm | 0.12 | 0.25 | 0.65 | 1.57 | 2.59 |
| | 0.2mm | 0.09 | 0.20 | 0.54 | 1.35 | 2.27 |
| | 0.3mm | 0.07 | 0.17 | 0.47 | 1.22 | 2.07 |

[Fig. 8]
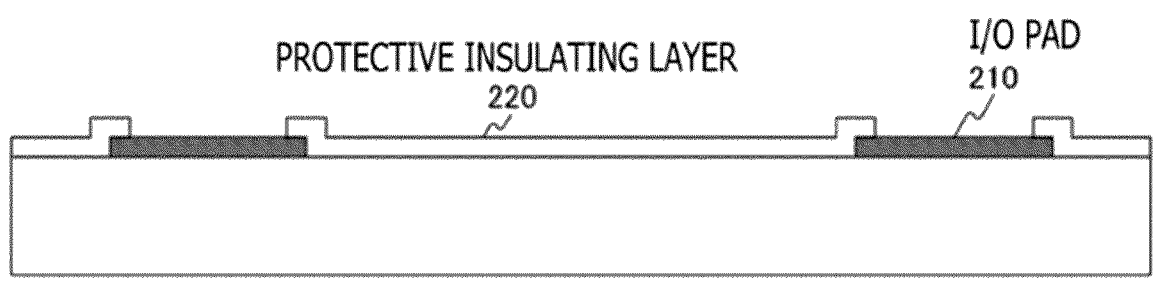
a
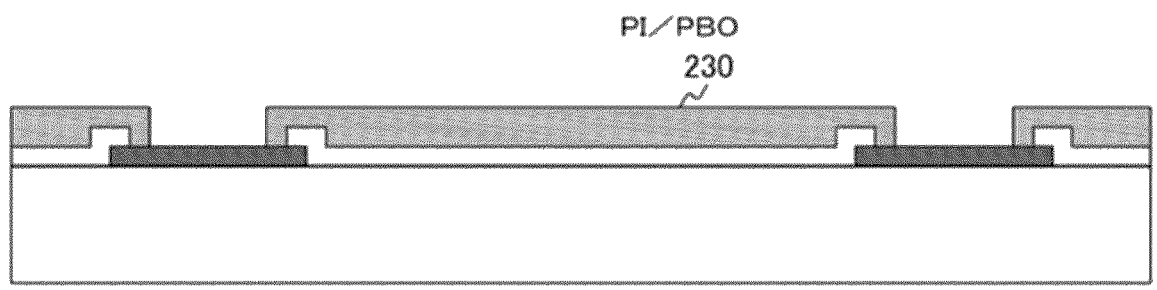
b
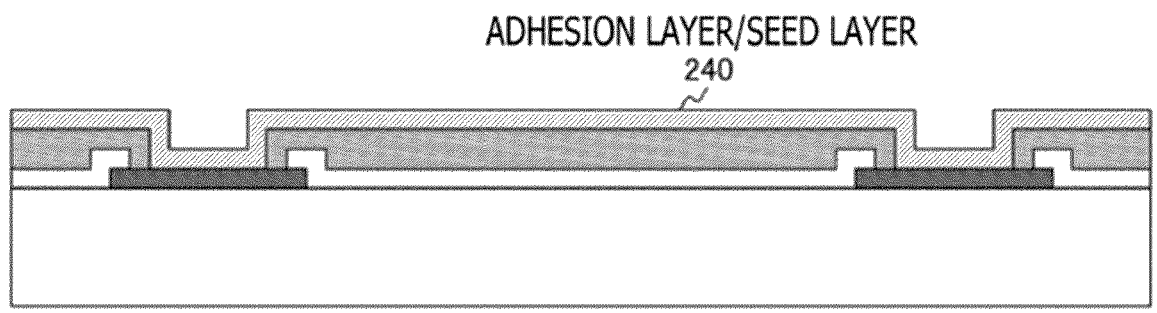
c

[Fig. 9]
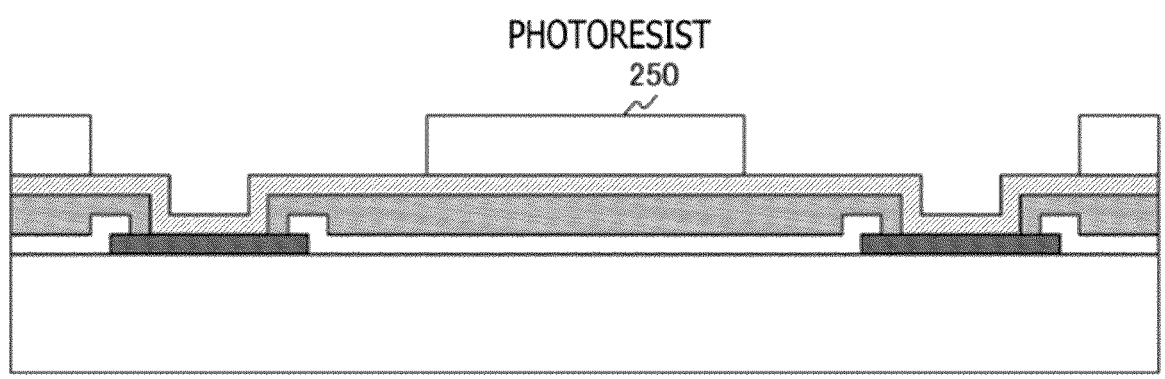
d
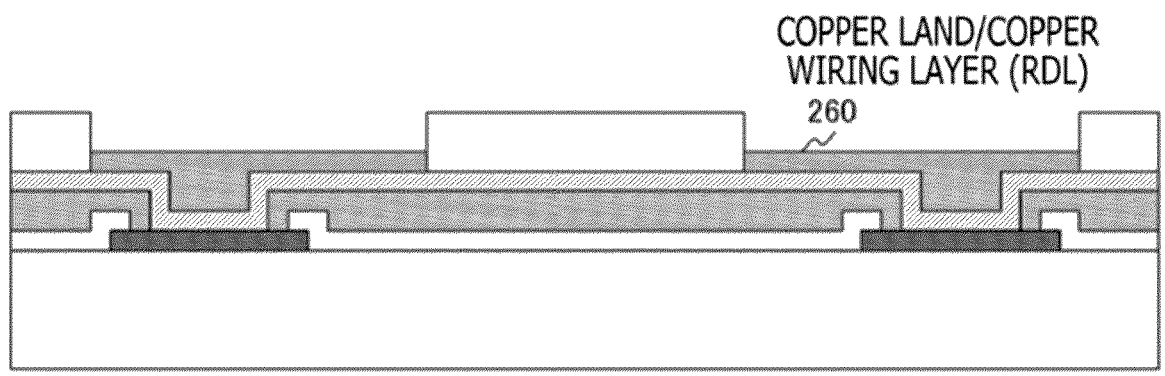
e
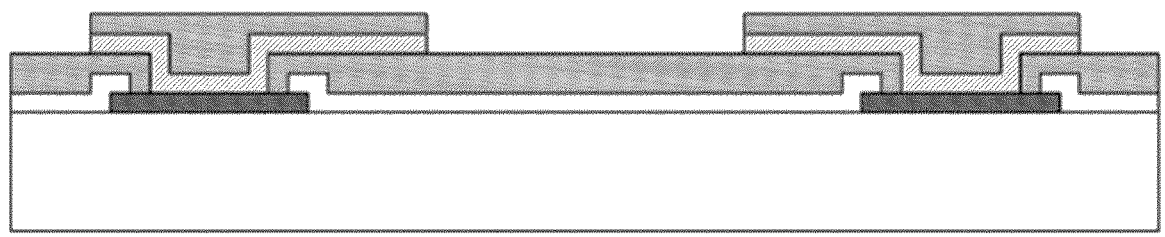
f

[Fig. 10]
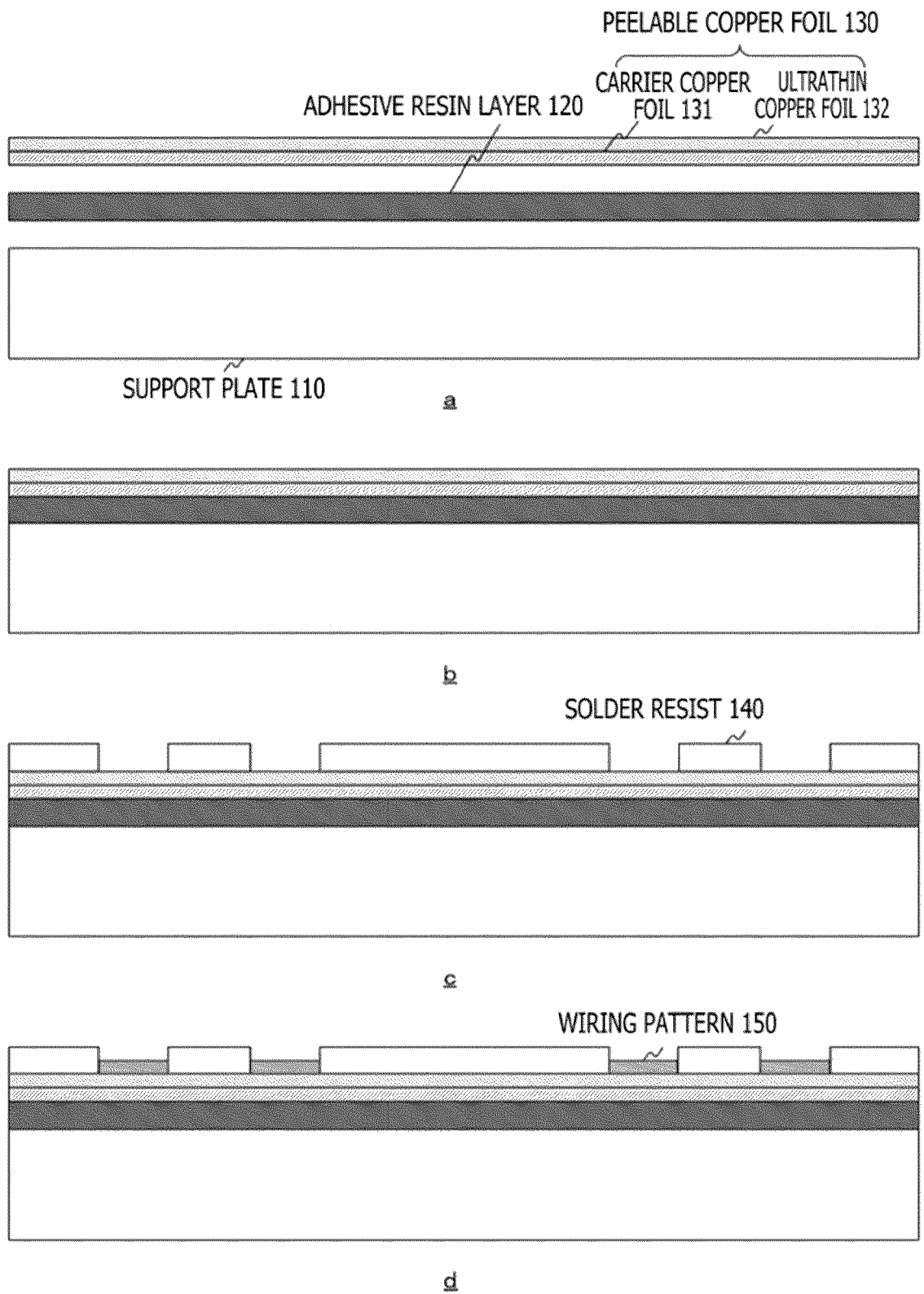

[Fig. 11]
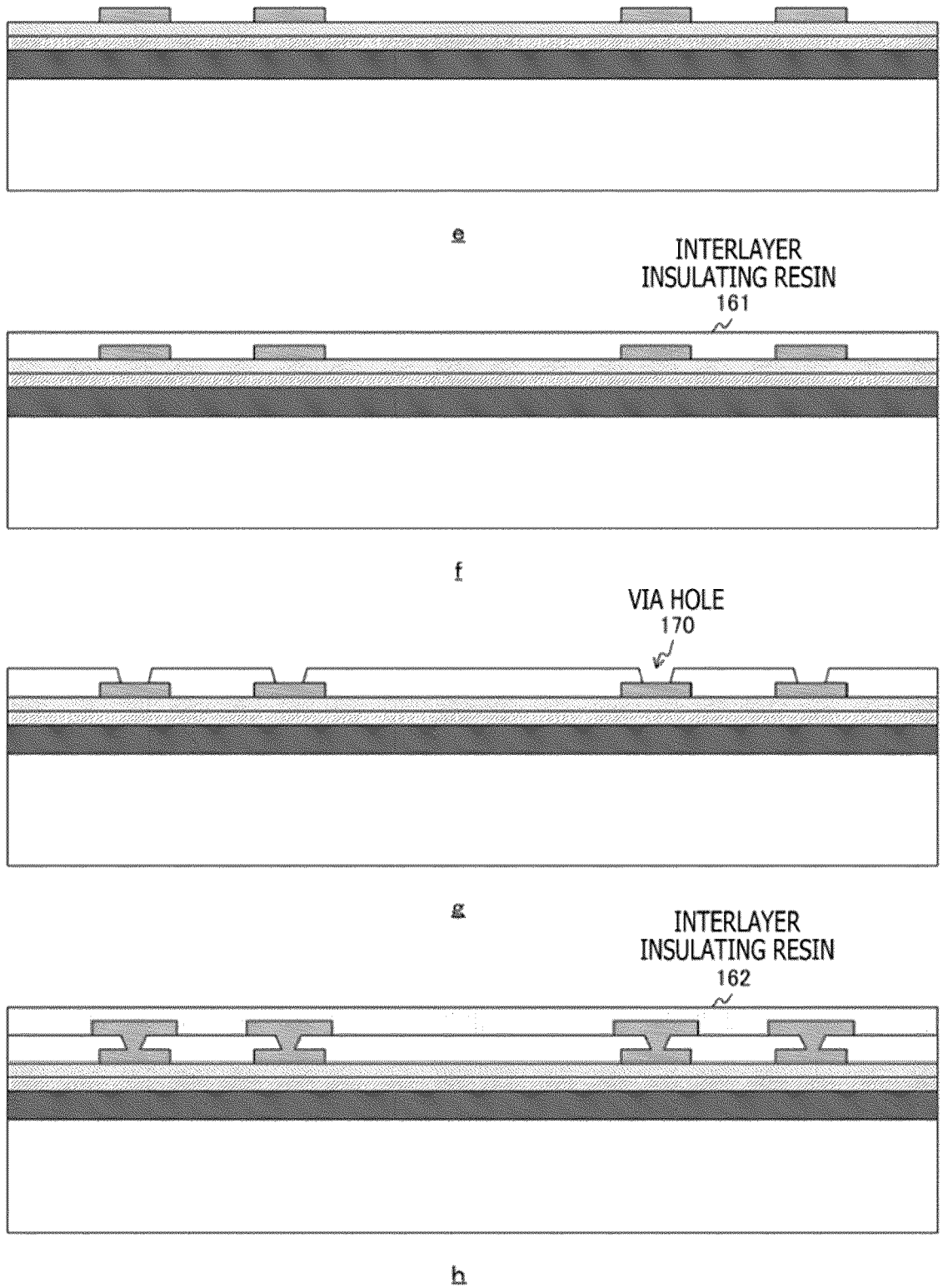

[Fig. 12]
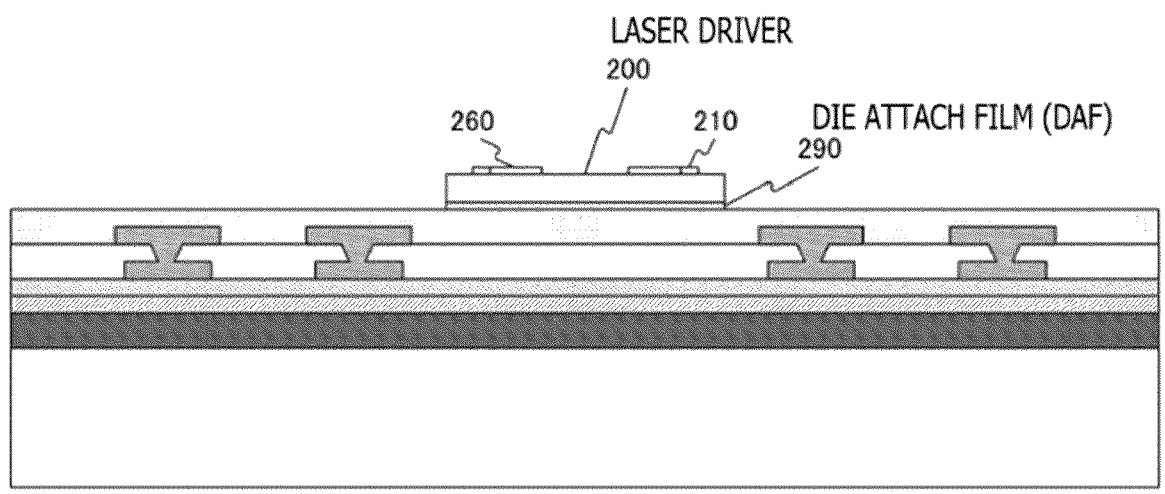
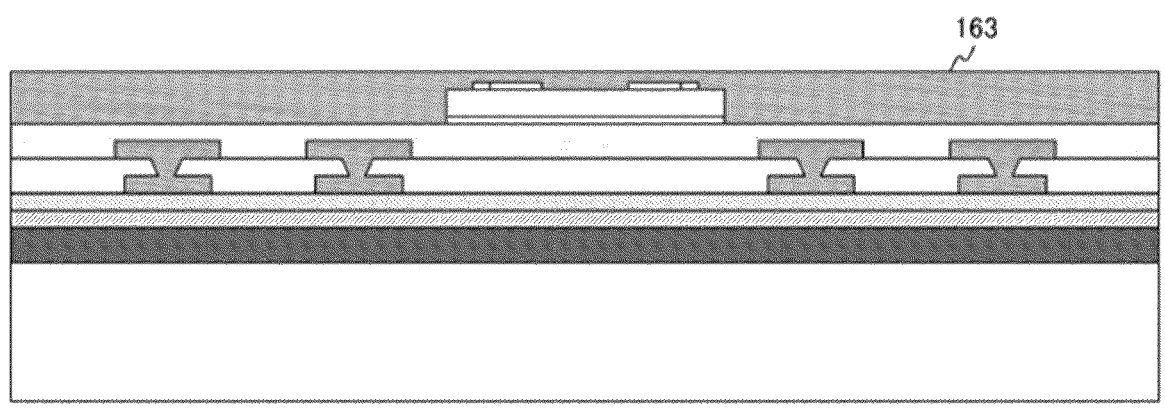
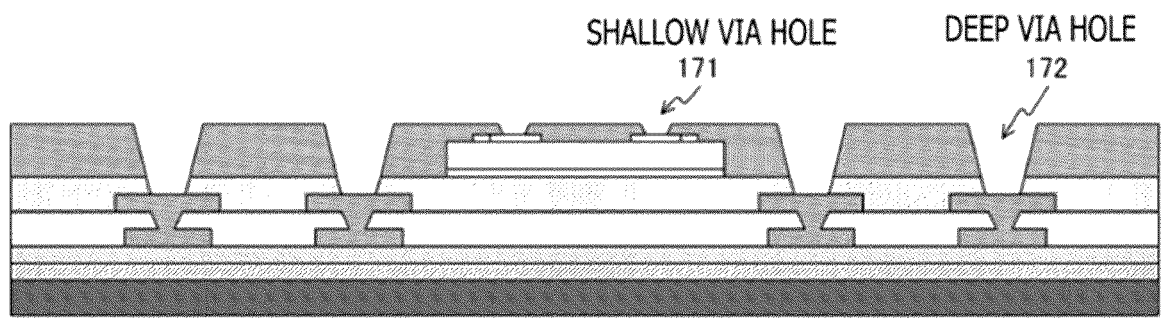

[Fig. 13]
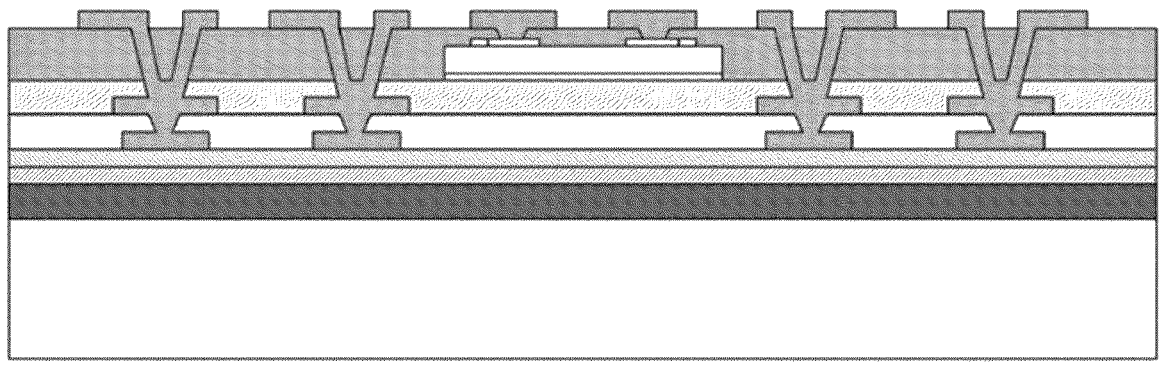
l
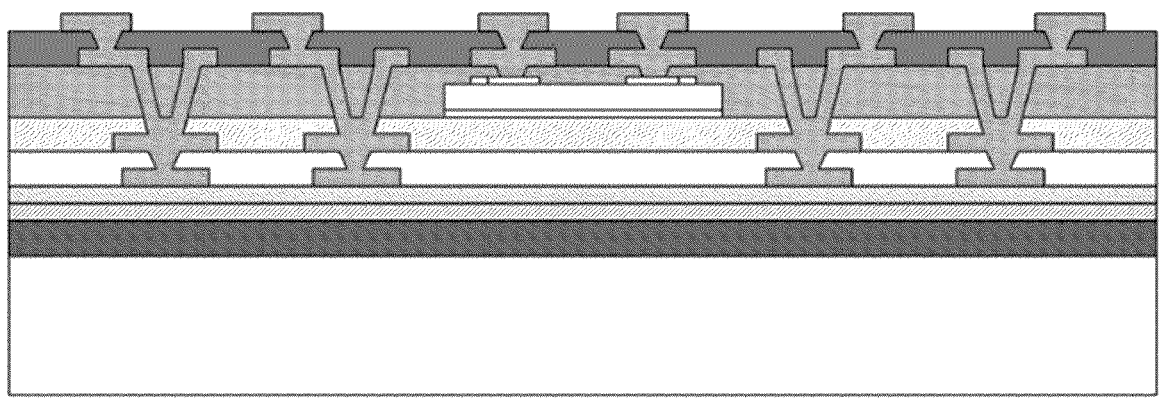
m
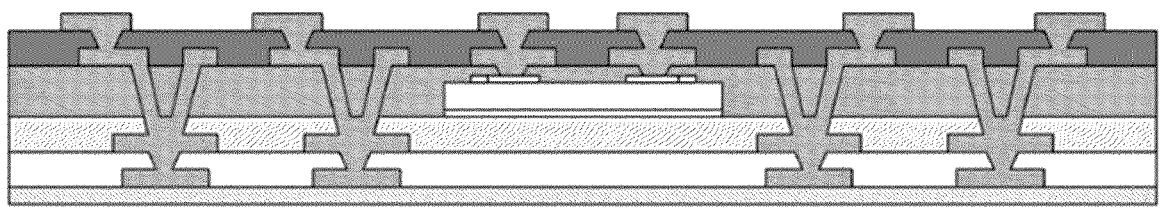
n

[Fig. 14]
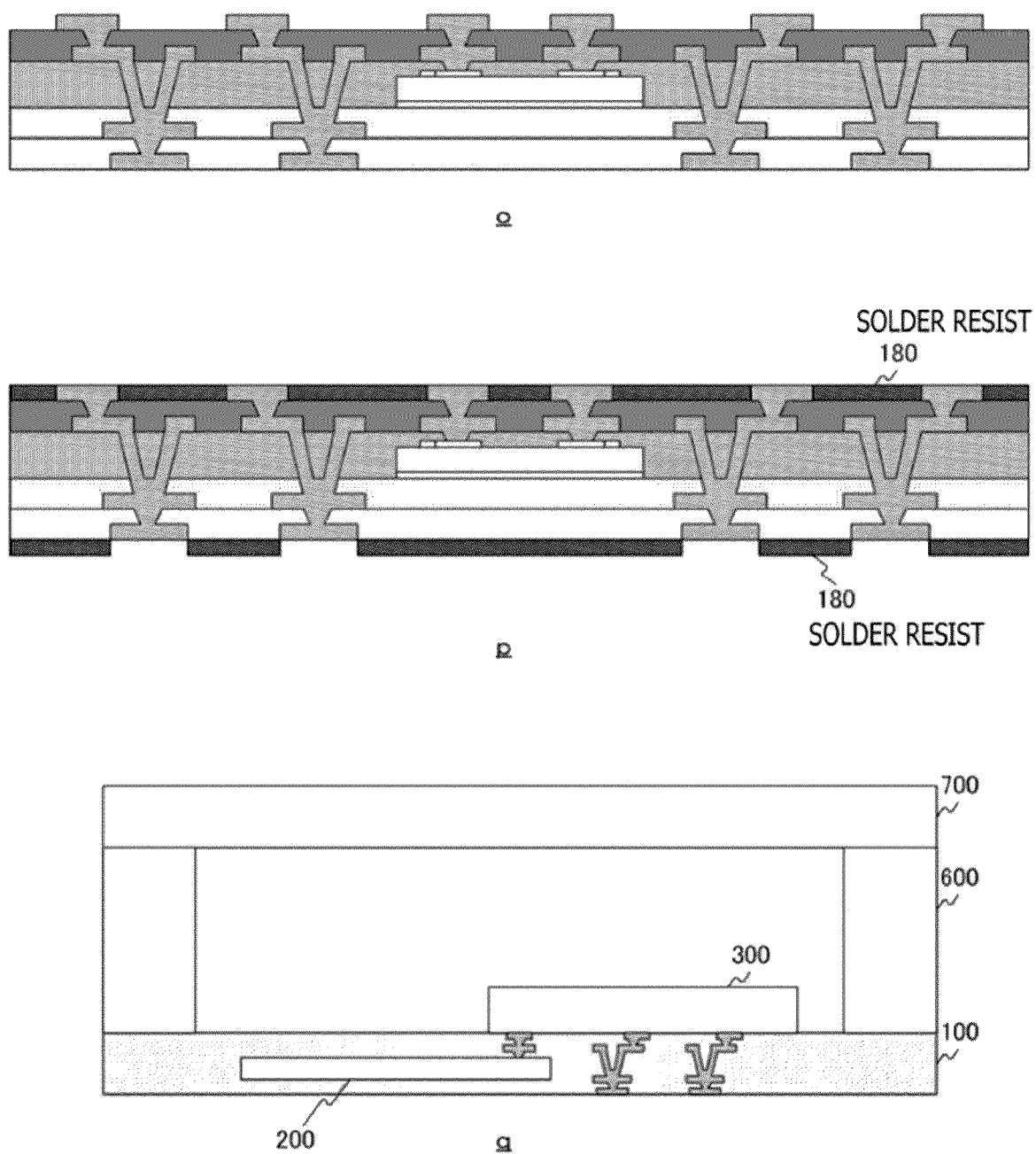

[Fig. 15]
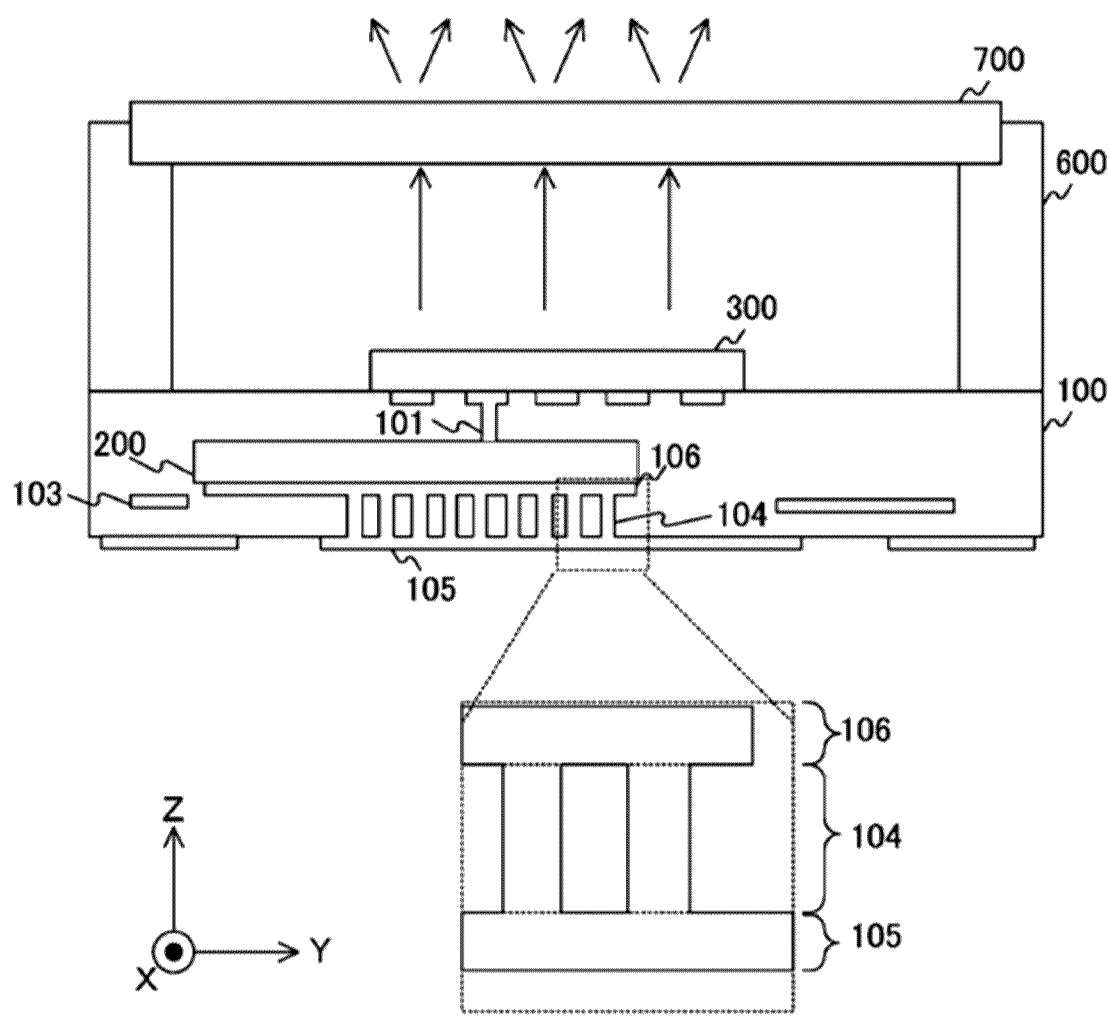

[Fig. 16]
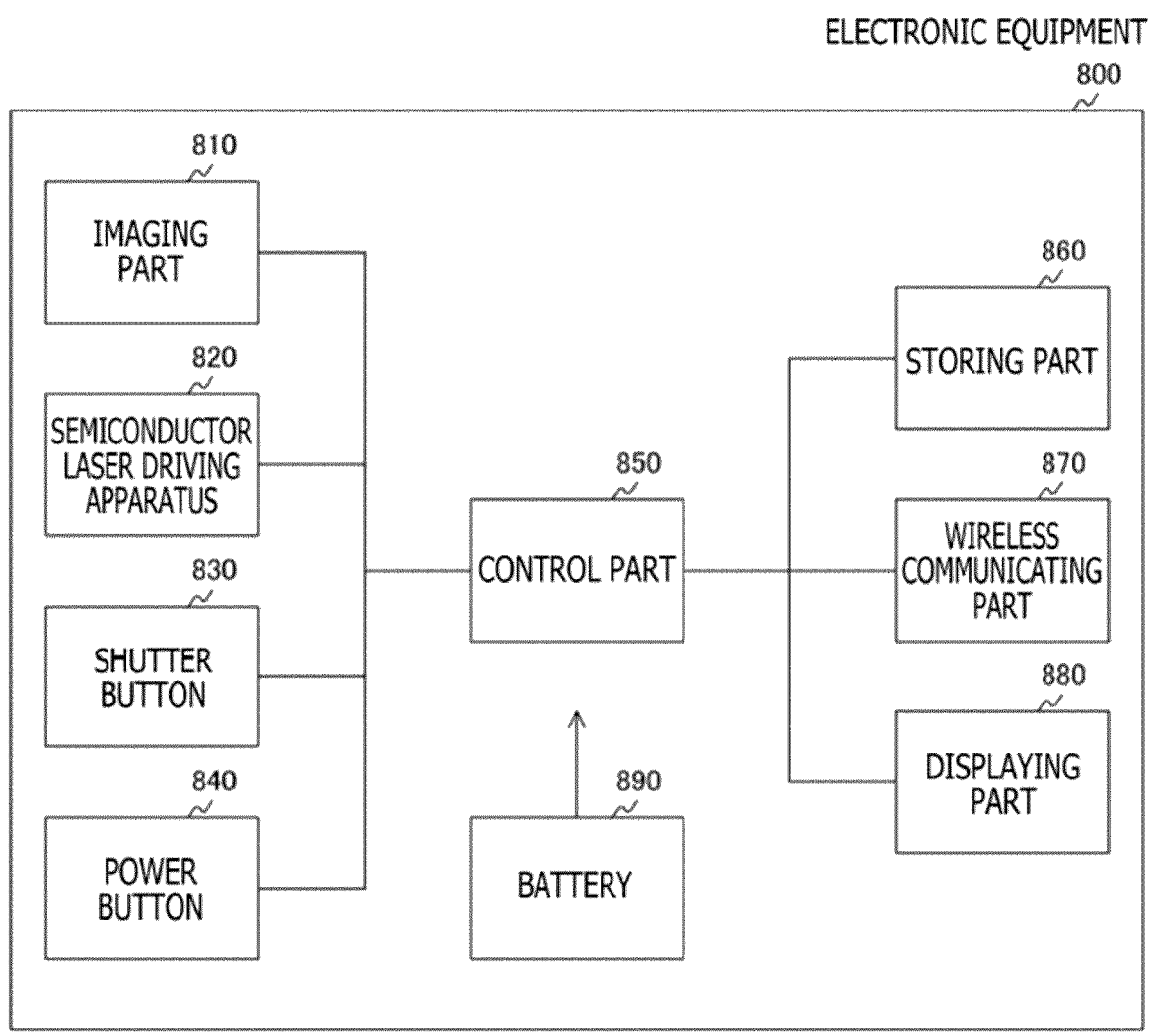

[Fig. 17]
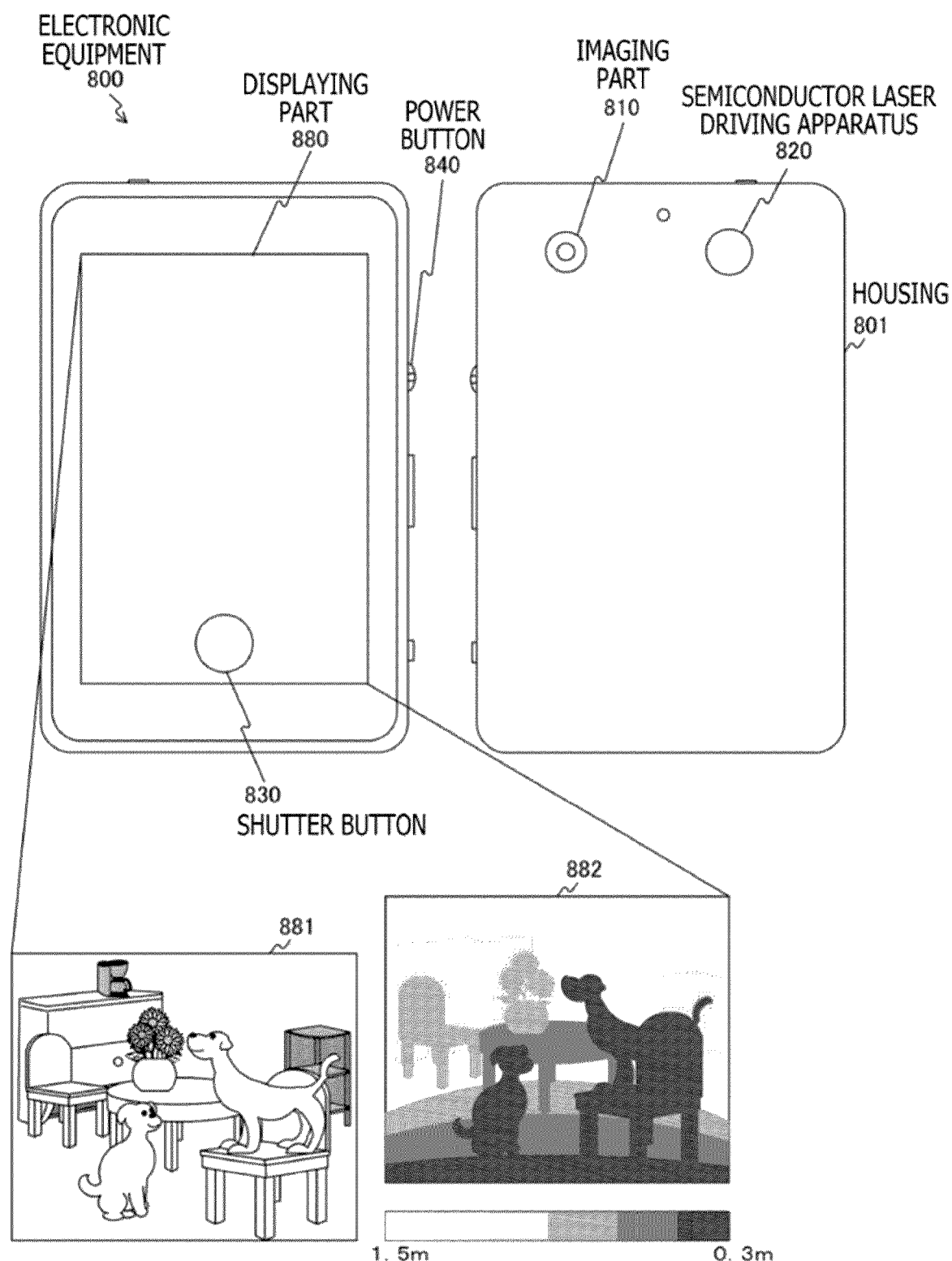

LIGHT EMITTING DEVICE, AND ELECTRONIC APPARATUS

CROSS REFERENCE TO RELATED APPLICATIONS

This application is a national stage application under 35 U.S.C. 371 and claims the benefit of PCT Application No. PCT/JP2020/025772 having an international filing date of 1 Jul. 2020, which designated the United States, which PCT application claimed the benefit of Japanese Patent Application No. 2019-144174 filed 6 Aug. 2019, the entire disclosures of each of which are incorporated herein by reference.

TECHNICAL FIELD

The present technology relates to a semiconductor laser driving apparatus. In particular, the present technology relates to a semiconductor laser driving apparatus that incorporates a laser driver in a substrate, and electronic equipment.

BACKGROUND ART

In related art, a ranging method called ToF (Time of Flight) is often used in electronic apparatuses that each have a ranging function. This ToF is a method according to which a light-emitting part irradiates an irradiation light beam of a sine wave or a rectangular wave to an object, a light receiving part receives a reflection light beam from the object, and a ranging computing part measures a distance from a phase difference between the irradiation light beam and the reflection light beam. To realize the above ranging function, an optical module is known that has a light-emitting element and an electronic semiconductor chip configured to drive the light-emitting element accommodated in a case to be integrated with each other. For example, an optical module has been proposed that includes a laser diode array mounted in an aligned manner on an electrode pattern of a substrate and a laser driver electrically connected to the laser diode array (see PTL 1, for example).

CITATION LIST

Patent Literature

PTL 1: Japanese Patent Laid-Open No. 2009-170675

SUMMARY

Technical Problem

According to the above related-art technology, the laser diode array and the laser driver are integrated with each other to be configured as an optical module. In this related-art technology, however, the laser driver is incorporated in the substrate. Therefore, in a case where a heat dissipation performance of the substrate is low, a problem arises that it is difficult for the substrate to fully dissipate the heat generated by the laser driver and this heat is conducted to the laser diode, degrading a light-emitting property of the laser diode.

The present technology has been conceived in view of the above circumstances, and it is desirable to improve the heat dissipation performance of a semiconductor laser driving apparatus that has a laser driver disposed therein.

Solution to Problem

According to an embodiment of the present technology, there is provided a semiconductor laser driving apparatus including a substrate that incorporates a laser driver, a semiconductor laser that is mounted on one face of the substrate, a connecting wire that electrically connects the laser driver and the semiconductor laser to each other with a wiring inductance equal to or smaller than 0.5 nanohenries, and a driver-side thermal via that is disposed between the laser driver and an other face of the substrate, the driver-side thermal via dissipating heat generated by the laser driver to the other face. An action is thereby achieved that the heat generated by the laser driver is dissipated by the driver-side thermal via.

The semiconductor laser driving apparatus may further include a connection terminal for connection with an exterior on a face opposite to the one face of the substrate, and an end of the driver-side thermal via may be connected to the connection terminal. An action is thereby achieved that the heat generated by the laser driver is dissipated to the connection terminal.

The substrate may include an insulating layer and a conductor, the insulating layer may be arranged between the conductor and the laser driver, and an other end of the driver-side thermal via may be connected to the conductor. An action is thereby achieved that the heat generated by the laser driver is dissipated by the conductor and the driver-side thermal via.

The semiconductor laser driving apparatus may further include a metal film that is formed on a predetermined flat face of the laser driver, and an other end of the driver-side thermal via may be connected to the metal film. An action is thereby achieved that the heat generated by the laser driver is dissipated by the metal film and the driver-side thermal via.

The connection terminal may include at least any one of a solder ball, a copper core ball, a copper pillar bump, or a land grid array.

The connecting wire may preferably have a length equal to or smaller than 0.5 millimeters. Moreover, it is more preferred that the connection wire be equal to or shorter than 0.3 millimeters.

The connecting wire may pass through a connection via that is disposed in the substrate. An action is thereby achieved that the wiring length is reduced.

The semiconductor laser may be arranged above the laser driver such that a portion thereof overlaps the laser driver. In this case, the semiconductor laser may be arranged above the laser driver such that a portion corresponding to 50% or less in area of the semiconductor laser overlaps the laser driver.

The substrate may include a laser-side thermal via at a position at which the semiconductor laser is mounted. An action is thereby achieved that heat dissipation is facilitated.

The semiconductor laser driving apparatus may further include an outer wall that surrounds a region on the one face of the substrate, the region including the semiconductor laser, and a diffusion plate that covers from above the region surrounded by the outer wall.

The semiconductor laser driving apparatus may further include a photodiode that is mounted on the one face of the substrate, the photodiode monitoring a light intensity of a laser light beam irradiated from the semiconductor laser. An action is thereby achieved that an output of the semiconductor laser is maintained to be constant.

According to another embodiment of the present technology, there is provided electronic equipment including a substrate that incorporates a laser driver, a semiconductor laser that is mounted on one face of the substrate, a connecting wire that electrically connects the laser driver and the semiconductor laser to each other with a wiring inductance equal to or smaller than 0.5 nanohenries, and a driver-side thermal via that is disposed between the laser driver and an other face of the substrate, the driver-side thermal via dissipating heat generated by the laser driver to the other face. An action is thereby achieved that the heat generated by the laser driver is dissipated by the driver-side thermal via. According to an embodiment of the present technology, a light emitting device includes a first substrate, a light source on a first surface of the first substrate and that emits light toward an object, and a driver disposed in the first substrate and that drives the light source. The driver overlaps the light source in a plan view. The light emitting device includes at least one first via disposed in the first substrate and overlapping the driver in the plan view, and a first conductor on a second surface of the first substrate opposite the first surface and overlapping the light source, the driver, and the at least one first via in the plan view. The first conductor is connected to the at least one first via. The light emitting device includes a second conductor disposed in the substrate and overlapping the driver and the at least first one via in the plan view. The second conductor is connected to the at least one first via. The second conductor is between the at least one first via and the driver. The second conductor is spaced apart from the driver by a portion of the first substrate. The second conductor contacts the driver. The at least one first via is a plurality of first vias connected between the first conductor and the second conductor. The first conductor and the second conductor include a thermally conductive material. The light emitting device includes at least one second via connected between the driver and the light source. The at least one first via is located between a first surface of the driver and the second surface of the first substrate. The at least one second via is located between the light source and a second surface of the driver that is opposite the first surface of the driver. The at least one first via is a plurality of first vias. The plurality of first vias includes vias that overlap the light source in the plan view. At least some of the vias that overlap the light source extend along an edge of the driver. The light source includes a laser. According to an embodiment of the present technology, an electronic apparatus includes a light emitting device a first substrate, a light source on a first surface of the first substrate and that emits light toward an object, and a driver disposed in the first substrate and that drives the light source. The driver overlaps the light source in a plan view. The light emitting device includes at least one first via disposed in the first substrate and overlapping the driver in the plan view, and a first conductor on a second surface of the first substrate opposite the first surface and overlapping the light source, the driver, and the at least one first via in the plan view. The first conductor is connected to the at least one first via. The electronic apparatus includes a light detecting device on the first surface of the first substrate that detects light reflected from the object, a support structure that surrounds the light source and the light detecting device, and an optical element supported by the support structure and arranged over the light source. The optical element diffuses light from the light source. The electronic apparatus includes at least one passive component coupled to the light source and on the first surface of the first substrate, and the support structure further surrounds the at least one passive component. The at least one passive component includes a capacitor. According to an embodiment of the present technology, a light emitting device includes a first substrate, a light source on a first surface of the first substrate and that emits light toward an object, and a driver disposed in the first substrate and that drives the light source. The driver overlaps the light source in a plan view. The light emitting device includes at least one first via disposed in the first substrate and overlapping the driver in the plan view, a first conductor on a second surface of the first substrate opposite the first surface and overlapping the light source, the driver, and the at least one first via in the plan view, and a second conductor disposed in the first substrate and overlapping the driver and the light source in the plan view. The first conductor and the second conductor are connected to the at least one first via.

Advantageous Effects of Invention

Because the thermal vias are arranged between the laser driver and the back face of the substrate, the heat generated by the laser driver can be dissipated from the back face. The heat dissipation performance of the semiconductor laser driving apparatus can thereby be improved, and conduction of the heat generated by the laser driver 200 to the semiconductor laser can be suppressed.

BRIEF DESCRIPTION OF DRAWINGS

FIG. 1 is a diagram depicting an example of a plan view of a semiconductor laser driving apparatus in an embodiment of the present technology.

FIG. 2A is a diagram depicting an example of a cross-sectional view of the semiconductor laser driving apparatus acquired when the semiconductor laser driving apparatus is cut along a Y-axis in the embodiment of the present technology.

FIG. 2B is a diagram depicting another example of a cross-sectional view of the semiconductor laser driving apparatus acquired when the semiconductor laser driving apparatus is cut along a Y-axis in an embodiment of the present technology.

FIG. 3 is an example of a bottom view of the semiconductor laser driving apparatus in the embodiment of the present technology.

FIG. 4 is a diagram depicting an example of a cross-sectional view of the semiconductor laser driving apparatus acquired when the semiconductor laser driving apparatus is cut along an X-axis in the embodiment of the present technology.

FIG. 5 is a diagram depicting a definition of an overlap amount between a laser driver and a semiconductor laser in the embodiment of the present technology.

FIG. 6 is a diagram indicating numerical value examples of a wiring inductance in relation to a wiring length and a wiring width in a case where a wiring pattern is formed using an additive method.

FIG. 7 is a diagram indicating numerical value examples of the wiring inductance in relation to the wiring length and the wiring width in a case where a wiring pattern is formed using a subtractive method.

FIG. 8 is a first diagram depicting an example of steps of processing a copper land and a copper wiring layer (RDL) in a fabrication process of the laser driver of the embodiment of the present technology.

FIG. 9 is a second diagram depicting the example of the steps of processing the copper land and the copper wiring layer (RDL) in the fabrication process of the laser driver of the embodiment of the present technology.

FIG. 10 is a first diagram depicting an example of fabrication steps for a substrate in the embodiment of the present technology.

FIG. 11 is a second diagram depicting the example of the fabrication steps for the substrate in the embodiment of the present technology.

FIG. 12 is a third diagram depicting the example of the fabrication steps for the substrate in the embodiment of the present technology.

FIG. 13 is a fourth diagram depicting the example of the fabrication steps for the substrate in the embodiment of the present technology.

FIG. 14 is a fifth diagram depicting the example of the fabrication steps for the substrate in the embodiment of the present technology.

FIG. 15 is a diagram depicting an example of a cross-sectional view of the semiconductor laser driving apparatus acquired when the semiconductor laser driving apparatus is cut along the Y-axis in a modification example of the embodiment of the present technology.

FIG. 16 is a diagram depicting a system configuration example of electronic equipment that is an application example of the embodiment of the present technology.

FIG. 17 is a diagram depicting an outer appearance configuration example of the electronic equipment that is the application example of the embodiment of the present technology.

DESCRIPTION OF EMBODIMENTS

A mode for implementing the present technology (hereinafter, referred to as "embodiment") will be described below. The description will be made in the following order.
1. Embodiment (Semiconductor Laser Driving Apparatus)
2. Application Example (Electronic Equipment)

1. Embodiment

"Semiconductor Laser Driving Apparatus"

FIG. 1 is a diagram depicting an example of a plan view of a semiconductor laser driving apparatus 10 in the embodiment of the present technology.

This semiconductor laser driving apparatus 10 is assumed to measure a distance by ToF. The ToF presents high depth accuracy, which is not as high as that of a structured light, and also has a characteristic of being operable without problems even in a dark environment. In addition to the above, it is considered that the ToF has many advantages in terms of simplicity of the apparatus configuration, its cost, and the like, compared to other methods such as the structured light and a stereo camera.

In this semiconductor laser driving apparatus 10, a semiconductor laser (or light source) 300, a photodiode 400, and passive components 500 are mounted on a surface of a substrate 100 that incorporates a laser driver (or driver) 200, in an electrically-connected manner by wire boding. A printed wiring board is assumed as the substrate 100.

The semiconductor laser 300 is a semiconductor device that irradiates a laser light beam by causing a current to flow through a PN-junction of a compound semiconductor. Concerning the above, for example, aluminum gallium arsenic (AlGaAs), indium gallium arsenic phosphorus (InGaAsP), aluminum gallium indium phosphorus (AlGaInP), and gallium nitride (GaN) are assumed as the compound semiconductor to be used.

The laser driver 200 is a driver integrated circuit (IC) to drive the semiconductor laser 300. This laser driver 200 is incorporated in the substrate 100 in a face-up state. As to electric connection between the laser driver 200 and the semiconductor laser 300, a wiring inductance may need to be reduced and a wiring length is therefore desirably set to be as short as possible. A specific numerical value of this will be described later.

The photodiode 400 is a diode to detect light. This photodiode 400 is used for APC control (Automatic Power Control) to monitor a light intensity of the semiconductor laser 300 and to maintain an output of the semiconductor laser 300 to be constant.

The passive components 500 are circuit components other than active elements such as a capacitor and a resistor. These passive components 500 include a decoupling capacitor to drive the semiconductor laser 300.

Hereinafter, an axis that is perpendicular to the substrate 100 will be referred to as "Z-axis." Moreover, a predetermined axis that is parallel to the substrate 100 will be referred to as "X-axis" and an axis that is perpendicular to the X-axis and the Z-axis will be referred to as "Y-axis."

FIG. 2A is a diagram depicting an example of a cross-sectional view of the semiconductor laser driving apparatus 10 acquired when the semiconductor laser driving apparatus 10 is cut along the Y-axis in the embodiment of the present technology. For example, the cross-sectional view of FIG. 2A is acquired by cutting the substrate 100 along a line C-D in FIG. 1.

As exemplified in this drawing, of opposite faces of the substrate 100, a face on which the semiconductor laser 300 is mounted is set as a front face, and a planar connection terminal 105 for the exterior is disposed on a back face opposed to the front face. In this drawing, arrows indicate irradiation directions of light beams from the semiconductor laser 300.

Moreover, the substrate 100 includes conductors 103 in addition to the laser driver 200 and a connection via 101, and these are formed in an insulating layer of the substrate 100.

The conductors 103 are planar and formed at a plurality of positions in the substrate 100 with the purposes of heat dissipation and electric connection. For example, provided that a direction from the back face of the substrate 100 to the front face thereof is set as upward, a conductor 103 having a fixed area is formed under the laser driver 200 with the purpose of heat dissipation. The conductor 103 is not in close contact with the laser driver 200 and an insulating layer is arranged between the conductor 103 and the laser driver 200.

Moreover, a predetermined number of thermal vias 104 are disposed between the conductor 103 under the laser driver 200 and the back face of the substrate 100.

One end of each of the thermal vias 104 is connected to the conductor 103, and the other end thereof is connected to the connection terminal 105. With this configuration, the thermal via 104 can dissipate the heat generated by the laser driver 200 to the connection terminal 105 on the back face of the substrate 100. Note that the thermal via 104 is an example of a driver-side thermal via described in the appended claims.

In the semiconductor laser driving apparatus, the arrangement of the thermal vias 104 can enhance a heat dissipation performance (such as a thermal resistance) of the semiconductor laser driving apparatus 10. Conduction of the heat generated by the laser driver 200 to the semiconductor laser 300 can be suppressed by the enhancement of the heat dissipation performance, and degradation of the light-emitting property of the semiconductor laser 300 can thereby be prevented (or reduced). FIG. 2B is a diagram depicting another example of a cross-sectional view of the semiconductor laser driving apparatus 10 acquired when the semiconductor laser driving apparatus 10 is cut along the Y-axis in an embodiment of the present technology. For example, the cross-sectional view of FIG. 2B is acquired by cutting the substrate 100 along a line C-D in FIG. 1. FIG. 2B is the same as FIG. 2A except that FIG. 2B further illustrates an additional thermal structure 107, which includes an extension of conductor 103 and additional thermal vias that connect to conductor 105. Although FIG. 2B shows an example where the conductor 103 is extended, at least one embodiment includes a space between the conductor 103 and the thermal structure 107 so as to be separated by the substrate 100. The structure of FIG. 2B may provide further heat dissipation for the semiconductor laser 300 and/or the laser driver 200. The top of the additional thermal structure has a same planar structure as conductors 103/105 and is disposed in the substrate 100 some distance from a bottom of the semiconductor laser 300. This distance may be a design parameter set based on empirical evidence and/or preference.

FIG. 3 is a diagram depicting an example of a lower face of the semiconductor laser driving apparatus 10 (in other words, a back face of the substrate 100) in the embodiment of the present technology. As exemplified in this drawing, a plurality of the connection terminals 105 is arranged on the back face of the substrate 100. Here, it should be appreciated that the central connection terminals 105 in FIG. 3 mainly function to dissipate heat while at least some of the peripheral connection terminals 105 surrounding the central connectional terminals 105 may be used to carry electrical signals, for example, output signals from the laser driver 200 to the semiconductor laser 300. FIG. 3 illustrates an example with four central connection terminals 105, but more or fewer central connection terminals 105 may be included according to design preferences. In addition, any number of the connection terminals 105 may be used to carry electrical signals if desired.

FIG. 4 is a diagram depicting an example of a cross-sectional view of the semiconductor laser driving apparatus 10 acquired when the semiconductor laser driving apparatus 10 is cut along the X-axis in the embodiment of the present technology. For example, the cross-sectional view of FIG. 4 is acquired by cutting the substrate 100 along a line A-B in FIG. 1. Note that the thermal vias 104 and the like under the laser driver 200 are omitted in FIG. 4.

As described above, the substrate 100 incorporates the laser driver 200 and has the semiconductor laser 300 and the like mounted on the front face thereof. The semiconductor laser 300 and the laser driver 200 are connected with each other through the connection via 101. Reduction of the wiring length is enabled by use of this connection via 101. Note that the connection via 101 is an example of a connection wiring described in the appended claims.

Moreover, the substrate 100 includes a thermal via 102 for heat dissipation. The components mounted on the substrate 100 are heat generation sources, and the heat generated by the components (such as the semiconductor laser 300) can be dissipated from the back face of the substrate 100 by use of the thermal via 102. Note that the thermal via 102 is an example of a laser-side thermal via described in the appended claims.

The semiconductor laser 300, the photodiode 400, and the passive components 500 that are mounted on the front face of the substrate 100 are surrounded by a side wall (or support structure) 600. For example, a plastic material or a metal is assumed as a material of this side wall 600.

The upper face surrounded by the side wall 600 is covered by a diffusion plate 700. This diffusion plate 700 is an optical element to diffuse a laser light beam from the semiconductor laser 300 and is also called diffuser.

FIG. 5 is a diagram depicting a definition of an overlap amount between the laser driver 200 and the semiconductor laser 300 in the embodiment of the present technology.

Because it is assumed that the semiconductor laser 300 and the laser driver 200 are connected with each other through the connection via 101 as described above, these two are arranged overlapping with each other when viewed from the upper face. On the other hand, it is desirable that the thermal via 102 is disposed on a lower face of the semiconductor laser 300, and a region for the thermal via 102 may also need to be secured. The overlap amount between the laser driver 200 and the semiconductor laser 300 is therefore defined as follows to clarify a positional relation of these two.

In an arrangement depicted in a of this drawing, no overlapping region is present between these two when viewed from the upper face. The overlap amount in this case is defined as 0%. On the other hand, in an arrangement depicted in c of this drawing, the entire semiconductor laser 300 overlaps the laser driver 200 when viewed from the upper face. The overlap amount in this case is defined as 100%.

In addition, in an arrangement depicted in b of this drawing, a region that corresponds to a half of the semiconductor laser 300 overlaps the laser driver 200 when viewed from the upper face. The overlap amount in this case is defined as 50%.

In this embodiment, to dispose a region for the connection via 101 described above, it is desirable that the overlap amount is larger than 0%. On the other hand, taking into consideration the fact that a certain number of the thermal vias 102 are arranged directly below the semiconductor laser 300, it is desirable that the overlap amount is equal to or smaller than 50%. Accordingly, reduction of the wiring inductance and acquisition of a favorable heat dissipation performance are enabled by setting the overlap amount to be larger than 0% and equal to or smaller than 50%.

"Wiring Inductance"

As for the connection between the semiconductor laser 300 and the laser driver 200, the wiring inductance is problematic as described above. All conductors have an inductive component and, in a high frequency region like the ToF system, even the inductance of a significantly short lead wire may have an adverse effect. In other words, when a high frequency operation is executed, a driving waveform to drive the semiconductor laser 300 from the laser driver 200 is distorted due to the effect of the wiring inductance, and the operation may thereby become unstable.

Concerning the above, a theoretical formula to calculate the wiring inductance will be discussed. For example, an inductance IDC [μH] of a straight-line lead wire having a length of L [mm] and a circular cross-section whose radius is R [mm] is represented by a following equation in a free space. Note that ln represents a natural logarithm.

$$IDC = 0.0002L \cdot (\ln(2L/R) - 0.75)$$

Moreover, for example, an inductance IDC [μH] of a strip line (a substrate wiring pattern) having a length of L [mm], a width of W [mm], and a thickness of H [mm] is represented by a following equation in a free space.

$$IDC = 0.0002L \cdot (\ln(2L/(W+H)) + 0.2235((W+H)/L) + 0.5)$$

A wiring inductance [nH] between a laser driver incorporated in a printed wiring board and a semiconductor laser electrically connected to an upper portion of the printed wiring board is provisionally calculated, results of which are indicated in FIG. 4 and FIG. 5.

FIG. 6 is a diagram indicating numerical value examples of the wiring inductance in relation to the wiring length L and the wiring width W in a case where a wiring pattern is formed using an additive method. The additive method is a method of forming a pattern by causing copper to precipitate only on a suitable portion of an insulating resin surface.

FIG. 7 is a diagram indicating numerical value examples of the wiring inductance in relation to the wiring length L and the wiring width W in a case where a wiring pattern is formed using a subtractive method. The subtractive method is a method of forming a pattern by etching an unnecessary portion of a copper-clad laminated board.

In the case of a semiconductor laser driving apparatus like the ToF system, assuming that the semiconductor laser driving apparatus is driven at several hundred megahertz, it is desirable that the wiring inductance is equal to or smaller than 0.5 nH and it is more preferred that the wiring inductance be equal to or smaller than 0.3 nH. Therefore, taking into consideration the above results of the provisional calculation, it is considered that it is desirable that the wiring length between the semiconductor laser 300 and the laser driver 200 is set to be equal to or smaller than 0.5 millimeters, and it is more preferred that the wiring length be equal to or smaller than 0.3 millimeters.

"Fabrication Method"

FIG. 8 and FIG. 9 are diagrams depicting an example of steps of processing a copper land and a copper wiring layer (RDL: Redistribution Layer) in a fabrication process of the laser driver 200 in the embodiment of the present technology.

As depicted in a of FIG. 8, an I/O pad 210, for example including aluminum, is first formed on a semiconductor wafer. A protective insulating layer 220 is thereafter formed as a film of SiN or the like on a surface of the semiconductor wafer, and a region of the protective insulating layer 220 corresponding to the I/O pad 210 is opened as a hole.

As depicted in b of FIG. 8, a surface protective film 230 including polyimide (PI) or polybenzoxazole (PBO) is next formed as a film, and a region of the surface protective film 230 corresponding to the I/O pad 210 is opened as a hole.

As depicted in c of FIG. 8, titanium tungsten (TiW) of approximately several ten to 100 nm and copper (Cu) of approximately 100 to 1,000 nm are consecutively sputtered to thereby form an adhesion layer/seed layer 240. Here, a high-melting point metal such as chromium (Cr), nickel (Ni), titanium (Ti), titanium copper (TiCu), or platinum (Pt) or an alloy thereof may be applied as the adhesion layer in addition to titanium tungsten (TiW). Moreover, nickel (Ni), silver (Ag), gold (Au), or an alloy thereof may be applied as the seed layer in addition to copper (Cu).

As depicted in d of FIG. 9, to form the copper land and the copper wiring layer for electric connection, a photoresist 250 is patterned. More specifically, the pattern of the photoresist 250 is formed by steps of surface cleaning, resist coating, drying, exposure, and development.

As depicted in e of FIG. 9, a copper land/copper wiring layer (RDL) 260 for electric connection is next formed on the adhesion layer/seed layer 240 using a plating method. Concerning this, for example, an electrolytic copper plating method, an electrolytic nickel plating method, or the like is usable as the plating method. Moreover, it is desirable that a diameter of the copper land is approximately 50 to 100 micrometers, a thickness of the copper wiring layer is approximately 3 to 10 micrometers, and a minimum width of the copper wiring layer is approximately 10 micrometers.

As depicted in f of FIG. 9, the photoresist 250 is next removed, the copper land/copper wiring layer (RDL) 260 of a semiconductor chip is masked, and dry etching is executed. Concerning this, for example, ion milling in which an argon ion beam is irradiated is usable as the dry etching. The adhesion layer/seed layer 240 in an unnecessary region can be selectively removed by this dry etching, and the copper land and the copper wiring layer are separated from each other. In addition, this removal of the unnecessary region can also be executed by wet etching that uses aqua regia, a water solution of cerium ammonium nitrate or potassium hydroxide, or the like while the dry etching is more desirable taking into consideration side etching and reduction of a thickness of a metal layer constituting the copper land and the copper wiring layer.

FIG. 10 to FIG. 14 depict an example of fabrication steps for the substrate 100 in the embodiment of the present technology.

As depicted in a of FIG. 10, a peelable copper foil 130 having a two-layer structure that includes an ultrathin copper foil 132 and a carrier copper foil 131 is first caused to be thermocompression-bonded to a support plate 110 on one face thereof through an adhesive resin layer 120 by roll lamination or lamination press.

A substrate including an inorganic material, a metal material, a resin material, or the like is usable as the support plate 110. For example, silicon (Si), glass, a ceramic, copper, a copper-based alloy, aluminum, an aluminum alloy, stainless steel, a polyimide resin, or an epoxy resin is usable as the support plate 110.

A foil formed by causing the carrier copper foil 131 having a thickness of 18 to 35 micrometers to vacuum-adhere to the ultrathin copper foil 132 having a thickness of 2 to 5 micrometers is used as the peelable copper foil 130. For example, 3FD-P3/35 (produced by Furukawa Circuit Foil Co., Ltd.) or MT-18S5DH (produced by Mitsui Mining & Smelting Co., Ltd.) is usable as the peelable copper foil 130.

As a resin material of the adhesive resin layer 120, an organic resin such as an epoxy resin, a polyimide resin, a PPE resin, a phenol resin, a PTFE resin, a silicon resin, a polybutadiene resin, a polyester resin, a melamine resin, a urea resin, a PPS resin, or a PPO resin that includes a reinforcing material including a glass fiber is usable. Moreover, as the reinforcing material, in addition to the glass fiber, an aramid unwoven fabric, an aramid fiber, a polyester fiber, or the like is also usable.

As depicted in b of FIG. 10, a plating base conductive layer (not depicted) having a thickness of 0.5 to 3 micrometers is next formed on a surface of the ultrathin copper foil 132 of the peelable copper foil 130 by a non-electrolytic copper plating process. Note that this non-electrolytic copper plating process is a process that forms a conductive layer to be the base for an electrolytic copper plating with which a wiring pattern is next formed. The wiring pattern may however be formed, without executing this non-electrolytic copper plating process, by bringing an electrode for the electrolytic copper plating into direct contact with the peelable copper foil 130 and directly applying the electrolytic copper plating process on the peelable copper foil 130.

As depicted in c of FIG. 10, a photosensitive resist is next bonded to a surface of the support plate by roll lamination, and a resist pattern for the wiring pattern (a solder resist 140)

is thereby formed. For example, a plating resist of a dry film is usable as the photosensitive resist.

As depicted in d of FIG. 10, a wiring pattern 150 having a thickness of approximately 15 micrometers is next formed using an electrolytic copper plating process.

As depicted in e of FIG. 11, the plating resist is next caused to be peeled off. Roughening treatment is applied to a surface of the wiring pattern as pre-processing to form an interlayer insulating resin, thereby improving adhesiveness between the interlayer insulating resin and the wiring pattern. In addition, the roughening treatment can be executed using blackening treatment by oxidation-reduction treatment, or a hydrogen peroxide/sulfuric acid-based soft etching process.

As depicted in f of FIG. 11, an interlayer insulating resin 161 is thermocompression-bonded onto the wiring pattern by roll lamination or lamination press. For example, an epoxy resin having a thickness of 45 micrometers is roll-laminated. In a case where a glass epoxy resin is used, a copper foil having an optional thickness is overlapped to be thermocompression-bonded by lamination press. As the resin material of the interlayer insulating resin 161, an organic resin such as an epoxy resin, a polyimide resin, a PPE resin, a phenol resin, a PTFE resin, a silicon resin, a polybutadiene resin, a polyester resin, a melamine resin, a urea resin, a PPS resin, or a PPO resin is usable. Moreover, each of these resins alone is usable, and a combination of the resins that is formed by mixing the plurality of resins with each other, by producing a compound thereof, or the like, is also usable. Furthermore, an interlayer insulating resin that is formed by containing an inorganic filler in any one of the above materials, by mixing a reinforcing material of a glass fiber in any one of the above materials, or the like, is also usable.

As depicted in g of FIG. 11, a via hole for interlayer electric connection is next formed using a laser method or a photoetching method. In a case where the interlayer insulating resin 161 is a thermosetting resin, the via hole is formed using the laser method. As a laser light beam, an ultraviolet laser such as a harmonic YAG laser or an excimer laser, or an infrared laser such as a carbon dioxide laser is usable. Note that, in the case where the via hole is formed using a laser light beam, a thin resin film may remain on a bottom of the via hole, and a desmearing treatment is therefore executed. In this desmearing treatment, the resin is caused to swell by a strong alkali, and the resin is decomposed and removed using an oxidant such as chromic acid or a per-manganate water solution. Moreover, the resin can also be removed using a plasma process, or a sandblast process by an abrasive agent. In a case where the interlayer insulating resin 161 is a photosensitive resin, a via hole 170 is formed using a photoetching method. In short, the via hole 170 is formed by exposing the photosensitive resin using an ultraviolet light beam through a mask and thereafter executing development.

After the roughening treatment, a non-electrolytic plating process is next executed for a wall face of the via hole 170 and a surface of the interlayer insulating resin 161. A photosensitive resist is next caused to be bonded to the face of the interlayer insulating resin 161 whose surface has undergone the non-electrolytic plating process, using roll lamination. For example, a photosensitive plating resist film of a dry film is usable as the photosensitive resist in this case. A plating resist pattern whose portions corresponding to the via hole 170 and the wiring pattern are opened is formed by exposing this photosensitive plating resist film and thereafter executing development therefor. An electrolytic copper plating process is next applied to the opening portions of the plating resist pattern to achieve a thickness of 15 micrometers. The plating resist is next peeled off and the non-electrolytic plating remaining on the interlayer insulating resin is removed by hydrogen peroxide/sulfuric acid-based flash etching or the like, and the via hole 170 filled with the copper plating and the wiring pattern as depicted in h of the FIG. 11 are thereby formed. The similar roughening step for the wiring pattern and the similar formation step for the interlayer insulating resin 162 are thereafter repeatedly executed.

As depicted in i of FIG. 12, the laser driver 200 having the copper land and the copper wiring layer already processed to be thinned to have a thickness approximately from 30 to 50 micrometers, the laser driver 200 having a die attach film (DAF) 290 attached thereto, is next mounted in a face-up state.

As depicted in j of FIG. 12, an interlayer insulating resin 163 is next caused to be thermocompression-bonded by roll lamination or lamination press.

As depicted in k of FIGS. 12 and l of FIG. 13, the via hole processing, the desmearing treatment, the roughening treatment, the non-electrolytic plating process, and the electrolytic plating process are next executed that are similar to those executed so far. Note that processing for a shallow via hole 171 into the copper land of the laser driver 200, processing for a deep via hole 172 reaching one layer lower, the desmearing treatment, and the roughening treatment are concurrently executed.

Concerning the above, the shallow via hole 171 is a filled via that is filled with copper plating. A size and a depth of this via are each approximately 20 to 30 micrometers. Moreover, a size of the land is approximately 60 to 80 micrometers in diameter.

On the other hand, the deep via hole 172 is a what-is-called conformal via that has copper plating applied thereto only on the via outer side. A size and a depth of this via are each approximately 80 to 150 micrometers. Moreover, a size of the land is approximately 150 to 200 micrometers in diameter. Note that it is desirable that the deep via hole 172 is arranged away from an outer shape of the laser driver 200 through an insulating resin therebetween that is approximately 100 micrometers.

As depicted in m of FIG. 13, an interlayer insulating resin similar to the one used so far is next caused to be thermocompression-bonded by roll lamination or lamination press. At this time, an inner side of the conformal via is filled with the interlayer insulating resin. The via hole processing, the desmearing treatment, the roughening treatment, the non-electrolytic plating process, and the electrolytic plating process are next executed that are similar to those executed so far.

As depicted in n of FIG. 13, the support plate 110 is next separated by causing the support plate 110 to be peeled off from an interface between the carrier copper foil 131 and the ultrathin copper foil 132 of the peelable copper foil 130.

As depicted in o of FIG. 14, a component-incorporating substrate whose wiring pattern is exposed can next be acquired by removing the ultrathin copper foil 132 and the plating base conductive layer using sulfuric acid-hydrogen peroxide-based soft etching.

As depicted in p of FIG. 14, on the exposed wiring pattern, a solder resist 180 is next printed that has a pattern including an opening in a portion corresponding to the land of the wiring pattern. Note that the solder resist 180 can also be formed using a film-type one and using a roll coater. Non-electrolytic Ni plating is next formed by 3 micrometers or thicker in the land portion of the opening of the solder resist 180, and non-electrolytic Au plating is formed thereon by 0.03 micrometers or thicker. The non-electrolytic Au plating may be formed by 1 micrometer or thicker. Furthermore, solder can also be pre-coated thereon. Alternatively, in the opening of the solder resist 180, electrolytic Ni plating may be formed by 3 micrometers or thicker and electrolytic Au plating may be formed thereon by 0.5 micrometers or thicker. Further alternatively, in the opening of the solder resist 180, an organic rust prevention or mitigation coating may be formed other than the metal plating.

Moreover, cream solder may be applied by printing to the land for external connection and a BGA (Ball Grid Array) of a solder ball may be mounted thereon as the connection terminal 105. Moreover, a copper core ball, a copper pillar bump, a land grid array (LGA), or the like may be used as this connection terminal 105.

As depicted in q of FIG. 14, on the surface of the substrate 100 fabricated as above, the semiconductor laser 300, the photodiode 400, and the passive components 500 are mounted, and the side wall 600 and the diffusion plate 700 are attached thereto. In general, this is executed in the state of assembled substrates, and outer shapes are thereafter processed using a dicer or the like to be separated into individual chips.

Note that the example where the peelable copper foil 130 and the support plate 110 are used has been described with the above steps while a copper clad laminate (CCL) can also be used instead of the above. Moreover, as the fabrication method of incorporating the components in the substrate, a method of forming a cavity in the substrate to mount the components therein may also be used.

As above, according to the embodiment of the present technology, because the thermal vias 104 are arranged between the laser driver 200 and the back face of the substrate 100, the heat generated by the laser driver 200 can be dissipated from the back face. The heat dissipation performance of the semiconductor laser driving apparatus 10 can thereby be improved, and conduction of the heat generated by the laser driver 200 to the semiconductor laser 300 can be suppressed.

Modification Example

The conductor 103 connected to the thermal vias 104 is not in close contact with the laser driver 200 in the embodiment described above while, from the viewpoint of improvement of the heat dissipation performance, it is desirable that the conductor 103 is caused to be in close contact with the laser driver 200. A semiconductor laser driving apparatus 10 of a modification example of the embodiment differs from the embodiment in that the heat dissipation performance is further improved.

FIG. 15 is a diagram depicting an example of a cross-sectional view of the semiconductor laser driving apparatus 10 acquired when the semiconductor laser driving apparatus 10 is cut along the Y-axis in the modification example of the embodiment of the present technology. This semiconductor laser driving apparatus 10 of this modification example of the embodiment differs from that of the embodiment in that a metal film 106 is disposed under the laser driver 200 instead of the conductor 103. It should be appreciated that the additional thermal structure 107 from FIG. 2B may be incorporated into the embodiment shown in FIG. 15 if desired, for example, by extending the conductor 106 in the same manner as that shown for conductor 103 in FIG. 2B.

The metal film 106 is in close contact with a lower face of the laser driver 200 and is formed by, for example, vapor deposition or sputtering. This metal film 106 is connected to one end of each of the thermal vias 104.

At the fabrication steps, for example, immediately after the step in c of FIG. 8, a step of forming the metal film 106 on the lower face of the laser driver 200 by vapor deposition or the like is added.

As exemplified in this drawing, the metal film 106 at the one end of each of the thermal vias 104 is in close contact with the lower face of the laser driver 200, and the heat dissipation performance of the laser driver 200 can therefore be improved compared to a case where the conductor 103 is not is in close contact.

As above, according to the modification example of the embodiment of the present technology, the metal film 106 is formed on the lower face of the laser driver 200 and is connected to the thermal vias 104, so that the heat dissipation performance of the laser driver 200 can therefore be improved compared to a case where the conductor 103 is not is in close contact.

2. Application Example

"Electronic Equipment"

FIG. 16 is a diagram depicting a system configuration example of electronic equipment 800 that is an application example of the embodiment of the present technology.

This electronic equipment 800 is a mobile terminal that has the semiconductor laser driving apparatus 10 according to the above embodiment mounted thereon. This electronic equipment 800 includes an imaging part 810, a semiconductor laser driving apparatus 820, a shutter button 830, a power button 840, a control part 850, a storing part 860, a wireless communicating part 870, a displaying part 880, and a battery 890.

The imaging part 810 is an image sensor that images an object. The semiconductor laser driving apparatus 820 is the semiconductor laser driving apparatus 10 according to the above embodiment.

The shutter button 830 is a button to instruct an imaging timing for the imaging part 810 from the exterior of the electronic equipment 800. The power button 840 is a button to instruct turning on or off of a power source of the electronic equipment 800 from the exterior of the electronic equipment 800.

The control part 850 is a processing part that controls the entire electronic equipment 800. The storing part 860 is a memory storing therein data and programs that are used for the operation of the electronic equipment 800. The wireless communicating part 870 is a part that executes wireless communication with the exterior of the electronic equipment 800. The displaying part 880 is a display that displays thereon an image or the like. The battery 890 is a power source supply source that supplies the power source to the components of the electronic equipment 800.

A specific phase of a light emission control signal that controls the imaging part 810 and the semiconductor laser driving apparatus 820 (such as, for example, a rise timing) is set to be 0 degrees, an amount of light received from 0 degrees to 180 degrees is detected as Q1, and an amount of light received from 180 degrees to 360 degrees is detected as Q2. Moreover, the imaging part 810 detects an amount of light received from 90 degrees to 270 degrees as Q3 and detects an amount of light received from 270 degrees to 90 degrees as Q4. The control part 850 computes a distance d to an object using a following equation from these amounts of received light Q1 to Q4 and displays the distance d on the displaying part 880.

$$d = (c/4\pi f) \times \arctan\{(Q3-Q4)/(Q1-Q2)\} \quad (5)$$

In the above equation, a unit of the distance d is, for example, meter (m). c is a light speed and its unit is, for example, meter per second (m/s). arctan is an inverse function of a tangent function. The value of "(Q3−Q4)/(Q1−Q2)" indicates a difference in phase between an irradiated light beam and a reflected light beam. π represents a circumference ratio. Moreover, f is a frequency of the irradiated light beam and its unit is, for example, megahertz (MHz).

FIG. 17 is a diagram depicting an outer appearance configuration example of the electronic equipment 800 that is the application example of the embodiment of the present technology.

This electronic equipment 800 is accommodated in a housing 801, includes the power button 840 on a side face of the housing 801, and includes the displaying part 880 and the shutter button 830 on a front face of the housing 801. Moreover, the optical regions of the imaging part 810 and the semiconductor laser driving apparatus 820 are disposed on a back face of the housing 801.

The displaying part 880 not only can display thereon an ordinary captured image 881 but also can display thereon a depth image 882 in accordance with results of ranging by use of ToF.

Note that the mobile terminal like a smartphone is exemplified as the electronic equipment 800 in this application example while the electronic equipment 800 is not limited to this and may be, for example, a digital camera, a game machine, or a wearable device.

Note that the above embodiment presents an example to embody the present technology, and items in the embodiment and matters specifying the disclosure in the appended claims have correspondence relations therebetween. Similarly, the matters specifying the disclosure in the appended claims and the items in the embodiment of the present technology denoted by same names as those of the matters have correspondence relations therebetween. The present technology is however not limited to the embodiment and can be embodied by making various modifications to the embodiment within the scope not departing from the gist thereof.

Note that the effects described herein are merely exemplification and are not limitative, and, moreover, other effects may also be achieved.

The present technology may be configured according to the following:

(1)

A light emitting device, comprising:
 a first substrate;
 a light source on a first surface of the first substrate and that emits light toward an object;
 a driver disposed in the first substrate and that drives the light source, wherein the driver overlaps the light source in a plan view;
 at least one first via disposed in the first substrate and overlapping the driver in the plan view; and
 a first conductor on a second surface of the first substrate opposite the first surface and overlapping the light source, the driver, and the at least one first via in the plan view, wherein the first conductor is connected to the at least one first via.

(2)

The light emitting device of (1), further comprising:
 a second conductor disposed in the substrate and overlapping the driver and the at least first one via in the plan view.

(3)

The light emitting device of one or more of (1) to (2), wherein the second conductor is connected to the at least one first via.

(4)

The light emitting device of one or more of (1) to (3), wherein the second conductor is between the at least one first via and the driver.

(5)

The light emitting device of one or more of (1) to (4), wherein the second conductor is spaced apart from the driver by a portion of the first substrate.

(6)

The light emitting device of one or more of (1) to (5), wherein the second conductor contacts the driver.

(7)

The light emitting device of one or more of (1) to (6), wherein the at least one first via is a plurality of first vias connected between the first conductor and the second conductor.

(8)

The light emitting device of one or more of (1) to (7), wherein the first conductor and the second conductor include a thermally conductive material.

(9)

The light emitting device of one or more of (1) to (8), further comprising:
 at least one second via connected between the driver and the light source.

(10)

The light emitting device of one or more of (1) to (9), wherein the at least one first via is located between a first surface of the driver and the second surface of the first substrate.

(11)

The light emitting device of one or more of (1) to (10), wherein the at least one second via is located between the light source and a second surface of the driver that is opposite the first surface of the driver.

(12)

The light emitting device of one or more of (1) to (11), wherein the at least one first via is a plurality of first vias.

(13)

The light emitting device of one or more of (1) to (12), wherein the plurality of first vias includes vias that overlap the light source in the plan view.

(14)

The light emitting device of one or more of (1) to (13), wherein at least some of the vias that overlap the light source extend along an edge of the driver.

(15)

The light emitting device of one or more of (1) to (14), wherein the light source includes a laser.

(16)

An electronic apparatus, comprising:
 a light emitting device, comprising:
  a first substrate;
  a light source on a first surface of the first substrate and that emits light toward an object;

a driver disposed in the first substrate and that drives the light source, wherein the driver overlaps the light source in a plan view;

at least one first via disposed in the first substrate and overlapping the driver in the plan view; and a first conductor on a second surface of the first substrate opposite the first surface and overlapping the light source, the driver, and the at least one first via in the plan view, wherein the first conductor is connected to the at least one first via;

a light detecting device on the first surface of the first substrate that detects light reflected from the object;

a support structure that surrounds the light source and the light detecting device; and an optical element supported by the support structure and arranged over the light source.

(17) The electronic apparatus of (16), wherein the optical element diffuses light from the light source.

(18) The electronic apparatus of one or more of (16) to (17), further comprising:

at least one passive component coupled to the light source and on the first surface of the first substrate, wherein the support structure further surrounds the at least one passive component.

(19) The electronic apparatus of one or more of (16) to (18), wherein the at least one passive component includes a capacitor.

(20) A light emitting device, comprising:

a first substrate;

a light source on a first surface of the first substrate and that emits light toward an object;

a driver disposed in the first substrate and that drives the light source, wherein the driver overlaps the light source in a plan view;

at least one first via disposed in the first substrate and overlapping the driver in the plan view; and a first conductor on a second surface of the first substrate opposite the first surface and overlapping the light source, the driver, and the at least one first via in the plan view; and a second conductor disposed in the first substrate and overlapping the driver and the light source in the plan view, wherein the first conductor and the second conductor are connected to the at least one first via.

In addition, the present technology can take the following configurations.

(1) A semiconductor laser driving apparatus including:
a substrate that incorporates a laser driver;
a semiconductor laser that is mounted on one face of the substrate;
a connecting wire that electrically connects the laser driver and the semiconductor laser to each other with a wiring inductance equal to or smaller than 0.5 nanohenries; and
a driver-side thermal via that is disposed between the laser driver and an other face of the substrate, the driver-side thermal via dissipating heat generated by the laser driver to the other face.

(2) The semiconductor laser driving apparatus described in the above (1), further including:
a connection terminal for connection with an exterior on a face opposite to the one face of the substrate, in which an end of the driver-side thermal via is connected to the connection terminal.

(3) The semiconductor laser driving apparatus described in the above (2), in which
the substrate includes an insulating layer and a conductor,
the insulating layer is arranged between the conductor and the laser driver, and
an other end of the driver-side thermal via is connected to the conductor.

(4) The semiconductor laser driving apparatus described in the above (2), further including:
a metal film that is formed on a predetermined flat face of the laser driver, in which an other end of the driver-side thermal via is connected to the metal film.

(5) The semiconductor laser driving apparatus described in any one of the above (2) to (4), in which
the connection terminal includes at least any one of a solder ball, a copper core ball, a copper pillar bump, or a land grid array.

(6) The semiconductor laser driving apparatus described in any one of the above (1) to (5), in which
the connecting wire has a length equal to or smaller than 0.5 millimeters.

(7) The semiconductor laser driving apparatus described in any one of the above (1) to (6), in which
the connecting wire passes through a connection via that is disposed in the substrate.

(8) The semiconductor laser driving apparatus described in any one of the above (1) to (7), in which
the semiconductor laser is arranged above the laser driver such that a portion thereof overlaps the laser driver.

(9) The semiconductor laser driving apparatus described in the above (8), in which the semiconductor laser is arranged above the laser driver such that a portion corresponding to 50% or less in area of the semiconductor laser overlaps the laser driver.

(10) The semiconductor laser driving apparatus described in any one of the above (1) to (9), in which
the substrate includes a laser-side thermal via at a position at which the semiconductor laser is mounted.

(11) The semiconductor laser driving apparatus described in any one of the above (1) to (10), further including:
an outer wall that surrounds a region on the one face of the substrate, the region including the semiconductor laser; and
a diffusion plate that covers from above the region surrounded by the outer wall.

(12) The semiconductor laser driving apparatus described in any one of the above (1) to (11), further including:
a photodiode that is mounted on the one face of the substrate, the photodiode monitoring a light intensity of a laser light beam irradiated from the semiconductor laser.

(13) Electronic equipment including:
a substrate that incorporates a laser driver;
a semiconductor laser that is mounted on one face of the substrate;
a connecting wire that electrically connects the laser driver and the semiconductor laser to each other with a wiring inductance equal to or smaller than 0.5 nanohenries; and
a driver-side thermal via that is disposed between the laser driver and an other face of the substrate, the driver-side thermal via dissipating heat generated by the laser driver to the other face.

REFERENCE SIGNS LIST 10, 820 Semiconductor laser driving apparatus
100 Substrate
101 Connection via
102, 104 Thermal via
103 Conductor
105 Connection terminal
106 Metal film
107 Thermal structure
110 Support plate
120 Adhesive resin layer
130 Peelable copper foil
131 Carrier copper foil
132 Ultrathin copper foil
140, 180 Solder resist
150 Wiring pattern
161 to 163 Interlayer insulating resin
170 to 172 Via hole
200 Laser driver
210 I/O pad
220 Protective insulating layer
230 Surface protective film
240 Adhesion layer/seed layer
250 Photoresist
260 Copper land/copper wiring layer (RDL)
290 Die attach film (DAF)
300 Semiconductor laser
400 Photodiode
500 Passive component
600 Side wall
700 Diffusion plate
800 Electronic equipment
801 Housing
810 Imaging part
830 Shutter button
840 Power button
850 Control part
860 Storing part
870 Wireless communicating part
880 Displaying part
890 Battery

What is claimed is:

1. A light emitting device, comprising:
a first substrate;
a light source mounted on and in contact with a first surface of the first substrate, wherein the light source emits light toward an object;
a driver disposed in the first substrate, wherein the driver drives the light source, and wherein the driver overlaps the light source in a plan view;
at least one first via disposed in the first substrate, wherein the at least one first via overlaps the driver in the plan view; and
a first conductor on a second surface of the first substrate opposite the first surface, wherein the first conductor overlaps the light source, the driver, and the at least one first via in the plan view, and wherein the first conductor is connected to the at least one first via.

2. The light emitting device of claim 1, further comprising:
a second conductor disposed in the substrate and overlapping the driver and the at least first one via in the plan view.

3. The light emitting device of claim 2, wherein the second conductor is connected to the at least one first via.

4. The light emitting device of claim 3, wherein the second conductor is between the at least one first via and the driver.

5. The light emitting device of claim 3, wherein the second conductor is spaced apart from the driver by a portion of the first substrate.

6. The light emitting device of claim 3, wherein the second conductor contacts the driver.

7. The light emitting device of claim 3, wherein the at least one first via is a plurality of first vias connected between the first conductor and the second conductor.

8. The light emitting device of claim 3, wherein the first conductor and the second conductor include a thermally conductive material.

9. The light emitting device of claim 1, further comprising:
at least one second via connected between the driver and the light source.

10. The light emitting device of claim 9, wherein the at least one first via is located between a first surface of the driver and the second surface of the first substrate.

11. The light emitting device of claim 10, wherein the at least one second via is located between the light source and a second surface of the driver that is opposite the first surface of the driver.

12. The light emitting device of claim 1, wherein the at least one first via is a plurality of first vias.

13. The light emitting device of claim 12, wherein the plurality of first vias includes vias that overlap the light source in the plan view.

14. The light emitting device of claim 13, wherein at least some of the vias that overlap the light source extend along an edge of the driver.

15. The light emitting device of claim 1, wherein the light source includes a laser.

16. An electronic apparatus, comprising:
a light emitting device, comprising:
a first substrate;
a light source mounted on and in contact with a first surface of the first substrate and that emits light toward an object;
a driver disposed in the first substrate and that drives the light source, wherein the driver overlaps the light source in a plan view;
at least one first via disposed in the first substrate and overlapping the driver in the plan view; and
a first conductor on a second surface of the first substrate opposite the first surface and overlapping the light source, the driver, and the at least one first via in the plan view, wherein the first conductor is connected to the at least one first via;
a light detecting device on the first surface of the first substrate that detects light reflected from the object;
a support structure that surrounds the light source and the light detecting device; and
an optical element supported by the support structure and arranged over the light source.

17. The electronic apparatus of claim 16, wherein the optical element diffuses light from the light source.

18. The electronic apparatus of claim 16, further comprising:
at least one passive component coupled to the light source and on the first surface of the first substrate, wherein the support structure further surrounds the at least one passive component.

19. The electronic apparatus of claim 18, wherein the at least one passive component includes a capacitor.

20. A light emitting device, comprising:
- a first substrate;
- a light source mounted on and in contact with a first surface of the first substrate and that emits light toward an object;
- a driver disposed in the first substrate and that drives the light source, wherein the driver overlaps the light source in a plan view;
- at least one first via disposed in the first substrate and overlapping the driver in the plan view;
- a first conductor on a second surface of the first substrate opposite the first surface and overlapping the light source, the driver, and the at least one first via in the plan view; and
- a second conductor disposed in the first substrate and overlapping the driver and the light source in the plan view, wherein the first conductor and the second conductor are connected to the at least one first via.

\* \* \* \* \*